(12) United States Patent
Huebner

(10) Patent No.: US 9,066,442 B2
(45) Date of Patent: Jun. 23, 2015

(54) STAND FOR ELECTRONIC APPARATUS

(71) Applicant: Wacom Co. Ltd., Saitama (JP)

(72) Inventor: Volker Huebner, Erkrath (DE)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 14/170,230

(22) Filed: Jan. 31, 2014

(65) Prior Publication Data

US 2014/0263930 A1 Sep. 18, 2014

(30) Foreign Application Priority Data

Mar. 18, 2013 (JP) ................................ 2013-055474

(51) Int. Cl.
*A47B 23/00* (2006.01)
*A47B 23/04* (2006.01)
*H05K 7/16* (2006.01)
*F16M 11/10* (2006.01)
*F16M 11/38* (2006.01)
*F16M 13/00* (2006.01)

(52) U.S. Cl.
CPC .............. *H05K 7/16* (2013.01); *F16M 2200/08* (2013.01); *A47B 23/043* (2013.01); *F16M 2200/024* (2013.01); *F16M 11/10* (2013.01); *F16M 11/38* (2013.01); *F16M 13/00* (2013.01)

(58) Field of Classification Search
CPC ........... A47B 23/043; A47B 2023/049; F16M 11/10; F16M 11/38; F16M 2200/08; F16M 2200/024
USPC ......... 248/371, 456, 454, 460, 688, 917, 457, 248/458, 459, 463, 225.21, 455; 361/681, 361/682, 683; D14/447, 451, 453
See application file for complete search history.

(56) References Cited

U.S. PATENT DOCUMENTS

| | | | | |
|---|---|---|---|---|
| 5,035,393 A * | 7/1991 | Menaged | ....................... | 248/456 |
| 6,082,696 A * | 7/2000 | Patterson | ...................... | 248/454 |
| 7,758,009 B1 * | 7/2010 | Chang | ............................ | 248/460 |
| 8,100,376 B2 * | 1/2012 | Ye | ................................. | 248/454 |
| 8,459,453 B2 * | 6/2013 | Parker et al. | ................... | 206/320 |
| 2011/0121156 A1 | 5/2011 | Lee et al. | | |
| 2012/0210912 A1 | 8/2012 | Florendo | | |
| 2013/0299663 A1 * | 11/2013 | Pan et al. | ....................... | 248/371 |
| 2014/0263939 A1 * | 9/2014 | Rinner | .......................... | 248/688 |

FOREIGN PATENT DOCUMENTS

JP 2008115925 A 5/2008

OTHER PUBLICATIONS

Extended European Search Report, dated Sep. 26, 2014, for European Application No. 14160408.2-1751/2781819, 7 pages.

* cited by examiner

*Primary Examiner* — Tan Le

(74) *Attorney, Agent, or Firm* — Seed IP Law Group PLLC

(57) ABSTRACT

A stand for an electronic apparatus is provided, which is configured to support a rear surface of the electronic apparatus at different inclining heights. The stand includes a base section composed of a plate member having a first edge and a second edge, and the plate member is configured to rotationally support the electronic apparatus adjacent to the first edge and defines an area for facing the rear surface of the electronic apparatus. The area defines a plurality of leg sections of different sizes, each including a lock section configured to lock with the rear surface of the electronic apparatus and a support section provided adjacent to the second edge of the plate member to serve as a rotational support for the leg section relative to the plate member. The support sections that serve as rotational supports for the plurality of leg sections share a common rotational axis.

24 Claims, 10 Drawing Sheets

STAND FOR ELECTRONIC APPARATUS

BACKGROUND

1. Technical Field

The present invention relates to a stand for an electronic apparatus. More particularly, the present invention relates to a stand configured to be provided on the rear-surface side of an electronic apparatus to serve as a stand for the apparatus and used to change the orientation of the apparatus.

2. Description of the Related Art

In the past, a support stand was provided on the rear side of the main body of an electronic apparatus to obliquely erect the main body of the apparatus on a table as described, for example, in a document such as Japanese Patent Laid-open No. 2008-115925. As described in the document, on the front surface of the main body of the electronic apparatus, a display section and a display operation section are provided, whereas a tilt unit is provided on the rear surface of the main body of the electronic apparatus. The tilt unit is used to support the main body of the electronic apparatus at an inclination angle determined in advance.

The tilt unit includes engagement tooth rows, a pair of tilt support leg pivot support sections, and tilt support legs. The engagement tooth rows are provided on the left and right sides of the rear surface of the main body of the electronic apparatus. The tilt support leg pivot support sections are located below the engagement tooth rows and above a ground section of the main body of the electronic apparatus. The tilt support legs are linked to the tilt support leg pivot support sections in such a way that the tilt support legs can be mounted on and dismounted from the tilt support leg pivot support sections. In addition, both the tilt support legs have a tilt leg member to be placed on the installation surface, and a tilt stay for supporting the main body of the electronic apparatus at a predetermined angle of inclination in conjunction with the tilt leg member. The tilt leg member is swingably and detachably mounted on the tilt support leg pivot support section on the rear surface of the main body of the electronic apparatus. By selectively engaging a protruding engagement portion of the upper edge of the tilt stay on an engagement tooth portion of the engagement tooth row, the inclination angle of the main body of the electronic apparatus can be set to one of a plurality of stages.

BRIEF SUMMARY

However, the electronic apparatus may be used by placing the rear surface of the main body thereof on the table without erecting the main body thereof on a table. Alternatively, the electronic apparatus may be carried in a container such as a container case or the like. In such cases, in the conventional tilt unit described above, the user has to go to all the trouble to remove the tilt unit from the main body of the electronic apparatus. Thereafter, if the user desires to use the electronic apparatus by obliquely erecting the main body thereof on a table, the user needs to again install the already removed tilt unit on the main body.

The present invention has been made to solve the problems of the conventional technology described above. The present invention provides a stand for an electronic apparatus. According to aspects of the invention, the stand makes the electronic apparatus easier to carry even with the stand attached to the apparatus, allows the inclination angle of the main body of the electronic apparatus to be easily changed when the apparatus is used in an obliquely erected state on a table, and gives a high degree of usability.

According to one aspect of the present invention, a stand for an electronic apparatus is provided, which is configured to support a rear surface of the electronic apparatus at different inclining heights to thereby change the orientation of the electronic apparatus. The stand includes a base section composed of a plate member having a first edge and a second edge, and the plate member is configured to rotationally support the electronic apparatus adjacent to the first edge. The plate member defines an area for facing the rear surface of the electronic apparatus, and the area defines a plurality of leg sections. The plurality of leg sections each includes a lock section configured to lock with the rear surface of the electronic apparatus and a support section provided adjacent to the second edge of the plate member to serve as a rotational support for the leg section relative to the plate member. The plurality of leg sections respectively have different distances between the lock section and the support section. The support sections that serve as rotational supports for the plurality of leg sections share a common rotational axis. When one of the leg sections is selectively rotated relative to the plate member, its lock section locks with the rear surface of the electronic apparatus to support the electronic apparatus in an inclined state relative to the plate member.

According to one embodiment of the invention, a stand for an electronic apparatus is provided, to be installed on the rear-surface side of the electronic apparatus and to be used for changing the orientation of the electronic apparatus. The stand includes: a base section composed of a member having a plate shape including an area facing the rear surface of the electronic apparatus on one side of the thickness direction of the member, the base section being engaged with a portion of the rear surface of the electronic apparatus; and a plurality of leg sections provided in the area of the base section. The leg sections each includes a lock section configured to be locked on the rear surface of the electronic apparatus and a support section serving as a rotational support point, and has a different distance between the lock section and the support section. The support section of each of the leg sections has a rotational axis coincided with the axial directions of rotational axes of the leg sections. When one of the leg sections is selectively rotated with the support section thereof serving as a rotational support point, the lock section thereof is locked on the rear surface of the electronic apparatus, so that the electronic apparatus can be inclined with respect to the base section.

In the present invention having a configuration described above, when any of the different leg sections is selectively rotated with the support section thereof used as a support point, the lock section thereof is locked on the rear surface of the electronic apparatus, so that the electronic apparatus can be inclined with respect to the base section. Thus, in accordance with the condition in which the electronic apparatus is being used, the inclination angle formed by the electronic apparatus and the base section can be easily changed. As a result, the present invention provides the electronic apparatus with a high degree of usability.

A desirable configuration of the present invention is characterized in that: the base section includes a first engaging section to be engaged with a first engaged section provided on a portion of the rear surface of the electronic apparatus in order to make it possible to incline the electronic apparatus with respect to the base section, and the first engaging section and the first engaged section allow for inclining the electronic apparatus with respect to the base section.

In the present invention configured as described above, the first engaging section and the first engaged section can be used to incline the electronic apparatus with respect to the base section. Thus, in accordance with the condition in which the electronic apparatus is being used, the inclination angle formed by the electronic apparatus and the base section can be easily changed. As a result, the present invention provides the electronic apparatus with a high degree of usability.

A desirable configuration of the present invention is characterized in that, by engaging the first engaging section formed in a hook shape with the first engaged section formed on the rear surface of the electronic apparatus, the electronic apparatus is allowed to incline with the first engaging section used as a support point.

In the present invention configured as described above, by engaging the first engaging section with the first engaged section formed on the rear surface of the electronic apparatus, the electronic apparatus can be inclined with the first engaging section used as a support point. Thus, in accordance with the condition in which the electronic apparatus is being used, the inclination angle formed by the electronic apparatus and the base section can be easily changed. As a result, the present invention provides the electronic apparatus with a high degree of usability.

A desirable configuration of the present invention is characterized in that: each of the leg sections has a plate shape and is rotatably formed with the support section used as a support point between a folded position at which the leg section is to be folded to the base section and a support position at which the leg section is to be erected from the base section. The base section further includes a second engaging section to be engaged with the rear surface of the electronic apparatus to replace the lock section of each of the leg sections when the leg sections are folded to their respective folded positions.

In the present invention configured as described above, the second engaging section of the base section is engaged with the rear surface of the electronic apparatus to replace the lock section of each of the leg sections when the leg sections are folded to their respective folded positions. Thus, the base section can be attached to the electronic apparatus firmly, so that the electronic apparatus can be easily carried and offers a high degree of usability.

A desirable configuration of the present invention is characterized in that the second engaging section of the base section is enabled to be engaged with a second engaged section provided on the rear surface of the electronic apparatus.

In the present invention configured as described above, the second engaging section of the base section engages with the second engaged section provided on the rear surface of the electronic apparatus to replace the lock section of each of the leg sections when the leg sections are folded to their respective folded positions. Thus, the base section can be attached to the electronic apparatus firmly, so that the electronic apparatus can be easily carried and offers a high degree of usability.

A desirable configuration of the present invention is characterized in that the first engaging section and the second engaging section allow the second engaging section to be engaged with the first engaged section when the first engaging section is engaged with the second engaged section.

In the present invention configured as described above, by engaging the first engaging section of the base section with the second engaged section on the rear surface of the electronic apparatus and the second engaging section of the base section with the first engaged section on the rear surface of the electronic apparatus, the orientation of the electronic apparatus can be changed with respect to the base section when attaching the base section to the apparatus. Thus, the present invention provides the electronic apparatus with a high degree of usability.

A desirable configuration of the present invention is characterized in that the base section further includes accommodation section configured to accommodate the leg sections when the leg sections are rotated to their respective folded positions.

In the present invention configured as described above, the accommodation section of the base section is used for accommodating the leg sections when the leg sections are rotated to their respective folded positions. Thus, the total thickness of the electronic apparatus and the base section attached to the rear surface of the electronic apparatus can be set to a small value. As a result, the electronic apparatus can be easily carried and offers a high degree of usability.

A desirable configuration of the present invention is characterized in that the support section of each of the leg sections constitutes a flexible hinge section for biasing the leg sections from their respective support positions in the directions toward their respective folded positions.

In the present invention configured as described above, the flexible hinge section for biasing the leg sections from their respective support positions in the directions toward the folded positions of the leg sections is capable of reliably attaching the leg sections to the base section in a state of elastically biasing the leg sections against the base section, so that the upper surfaces of the leg sections are laid on the same plane as the upper surface of the base section when the leg sections are placed to their respective folded positions. Thus, when a leg section is inadvertently rotated about the axis of the hinge section to the support position, it is possible to prevent the base section from being inadvertently disengaged from the rear surface of the electronic apparatus. In addition, with a leg section placed at the support position thereof, it is possible to strengthen the state of attachment of the lock section of the leg section to the first or second engaged section on the rear surface of the electronic apparatus. Thus, it is possible to stably support and fix the electronic apparatus in a state inclined with respect to the base section by the leg sections.

A desirable configuration of the present invention is characterized in that: the leg sections include a first leg section, a second leg section, and a third leg section; the area of the base section further includes an inner periphery with which the first leg section is to be engaged and an outer peripheral portion in which the upper surface of the base section is to be formed; the first leg section has a first outer edge to be engaged with the inner periphery and a first inner edge formed on a side interior to the first outer edge; the second leg section has a second outer edge to be engaged with the first inner edge of the first leg section and a second inner edge formed on a side interior to the second outer edge; the third leg section has a third outer edge to be engaged with the second inner edge of the second leg section; and when the first leg section is rotated, the second leg section is engaged with the first leg section to cooperate in a state of engaging the third leg section with the second leg section and, when the second leg section is rotated, cooperation is carried out in a state of engaging the third leg section with the second leg section.

In the present invention configured as described above, when the first leg section is rotated, the second leg section is engaged with the first leg section while cooperation is carried out in a state of engaging the third leg section with the second leg section and, when the second leg section is rotated, cooperation is carried out in a state of engaging the third leg section with the second leg section. Thus, in accordance with the condition in which the electronic apparatus is being used, the inclination angle formed by the electronic apparatus and the base section can be easily changed. As a result, the present invention provides the electronic apparatus with a high degree of usability.

A desirable configuration of the present invention is characterized in that the base section is formed into a rectangular shape and the first engaging section is formed on a specific periphery section of the area whereas the support section is provided on the other periphery section included in the area as a section located on the opposite side from the specific periphery section.

In the present invention configured as described above, in accordance with the condition in which the electronic apparatus is being used, the inclination angle formed by the electronic apparatus and the base section can be easily changed. As a result, the present invention provides the electronic apparatus with a high degree of usability.

A desirable configuration of the present invention is characterized in that the inner periphery of the outer peripheral portion provided in the area of the base section includes a finger insertion cutout portion which is a cutout portion formed by cutting out the inner periphery so that a finger of the user can be inserted into the cutout portion.

In the present invention configured as described above, when the user makes an attempt to move a leg section to a support position from a folded position, in which the upper surface of the leg section is coplanar with the upper surface of the base section, the user may insert a finger into the finger insertion cutout portion and easily raise the finger insertion cutout portion by merely picking the finger insertion cutout portion in order to erect the leg section on the base section. As a result, the present invention provides the electronic apparatus with a high degree of usability.

A desirable configuration of the present invention is characterized in that: the lock section of each of the first to third leg sections is composed of a protrusion so formed that the lock section can be inserted into the second engaged section formed on the rear surface of the electronic apparatus, and when the first to third leg sections are rotated to their respective support positions, the protrusion of each of the first to third leg sections is inserted into the second engaged section formed on the rear surface of the electronic apparatus.

In the present invention configured as described above, when the first to third leg sections are rotated to their respective support positions, the protrusion of each of the first to third leg sections is inserted into the second engaged section formed on the rear surface of the electronic apparatus. Thus, it is possible to stably support and fix the electronic apparatus in a state inclined with respect to the base section by the leg sections.

A desirable configuration of the present invention is characterized in that the cutout portion provided in the inner periphery of the outer peripheral portion is provided at a position corresponding to a first lock section provided on the first leg section with the first leg section rotated to the folded position.

In the present invention configured as described above, the cutout portion provided in the inner periphery of the outer peripheral portion of the base section is provided at a position corresponding to the first lock section of the first leg section when the first leg section is rotated to the folded position. Thus, when the user makes an attempt to move a leg section to a support position from a folded position, the user may insert a finger into the finger insertion cutout portion and easily raise the cutout portion by merely picking the cutout portion in order to erect the leg section on the base section. As a result, the present invention provides the electronic apparatus with a high degree of usability.

In accordance with the stand for an electronic apparatus provided by the present invention according to various embodiments, the apparatus is easy to carry even when the stand is attached to the apparatus. When the electronic apparatus is used in an obliquely erected state on a table, the inclination angle of the main body of the electronic apparatus with respect to the table can be easily changed. As a result, the present invention provides the electronic apparatus with a high degree of usability.

DETAILED DESCRIPTION

Stands according to embodiments of the present invention are explained below in reference to accompanying drawings.

Figure 1:
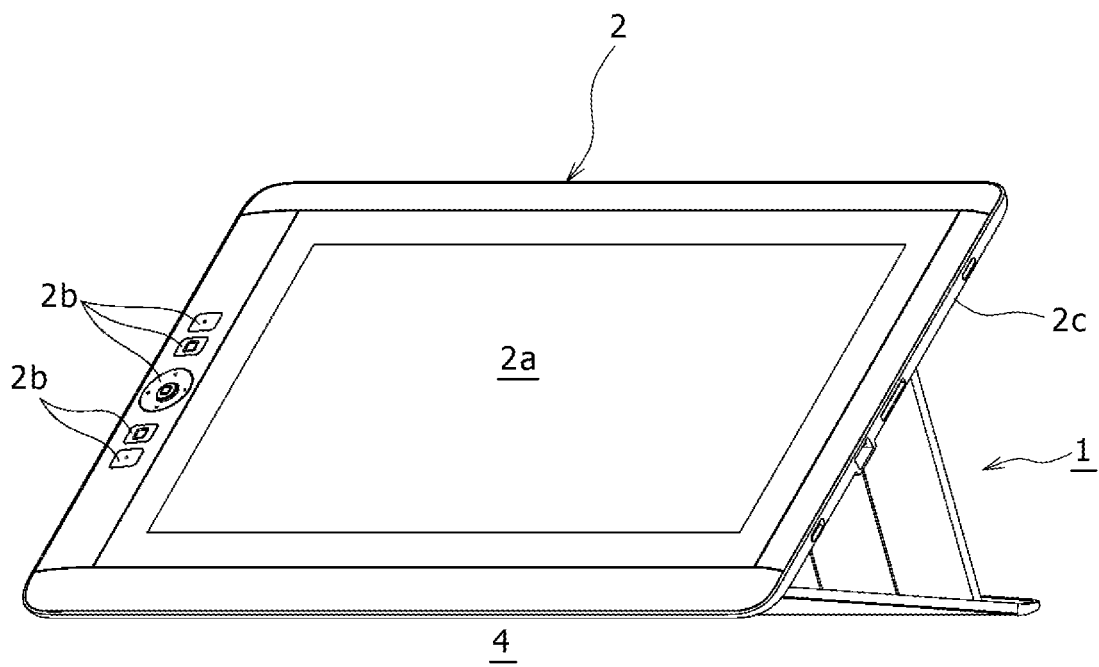
FIG. 1 is a schematic perspective view showing a state in which a stand according to an embodiment of the present invention supports a tablet-terminal main body from a rear side of the main body, as seen obliquely from a front side of the main body.
Figure 2:
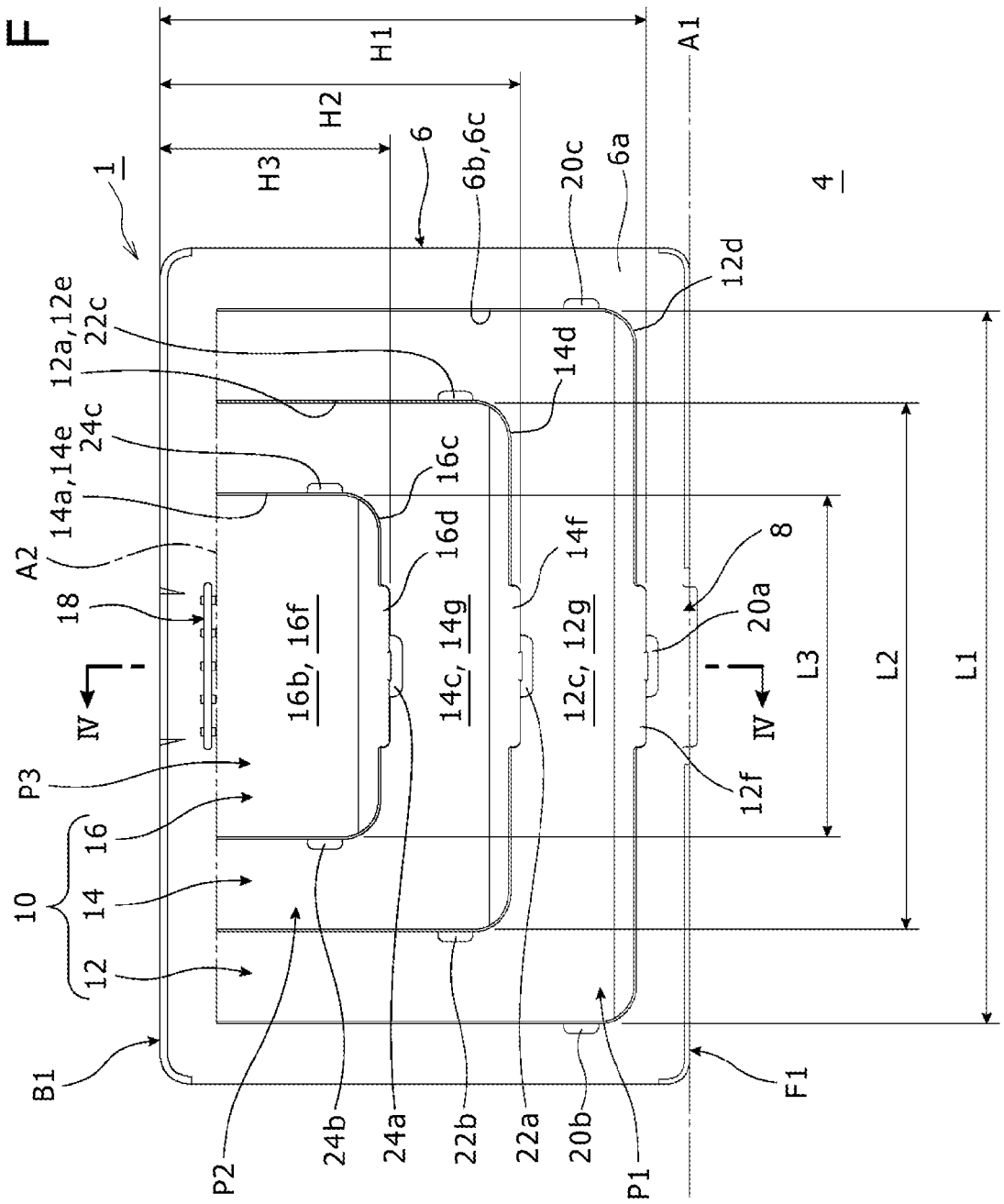
FIG. 2 is a top view of the stand according to the embodiment of the present invention.

FIG. 1 is a schematic perspective view showing a state, in which a stand 1 according to an embodiment of the present invention supports a tablet-terminal main body 2 from a rear side of the main body, as seen obliquely from a front side of the main body. FIG. 2 is a top view of the stand 1 according to the embodiment of the present invention.

As shown in FIGS. 1 and 2, the stand 1 according to the embodiment of the present invention supports the rear side of the tablet-terminal main body 2 serving as an electronic apparatus in such a way that the tablet-terminal main body 2 is obliquely erected on an upper surface 4 of a table. The stand 1 includes a base section 6, which has a plate shape and is placed on the upper surface 4 of the table.

A liquid-crystal display section 2a having a rectangular shape is provided at the center of the surface of the tablet-terminal main body 2, to which the stand 1 according to the embodiment is attached. On the left side of the liquid-crystal display section 2a as shown in FIG. 1, a plurality of operation buttons 2b are provided.

It is to be noted that the coordinates of any position on the liquid-crystal display section 2a can be entered to the tablet-terminal main body 2 by pressing a special electronic pen, a pen-shaped object or the like against the position. Note that the special electronic pen or the like is not shown in the figures. A sensor embedded in the tablet-terminal main body 2 (not shown in the figures) reads the position, and the position read by the sensor and information of movement are transferred to a computer main body (not shown in the figures). In other words, the tablet-terminal main body 2 is a typical implementation of the so-called pen tablet terminal. However, embodiments of the invention are not limited to such an implementation of a tablet terminal. Another embodiment can be another tablet terminal implemented to include a touch panel and a display unit. In addition, the display unit of the tablet terminal can be a display unit other than a liquid-crystal display unit. Still further, the electronic-apparatus main body, to which the stand 1 according to this embodiment is attached, does not have to be the tablet-terminal main body 2. The electronic-apparatus main body can also be the main body of another electronic apparatus such as a notebook personal computer or a cellular phone.

Next, an upper surface 6a of the base section 6 is explained in reference to FIG. 2.

In FIG. 2, the front and rear sides of the base section 6 are denoted by notations F1 and B1, respectively. On the other hand, the right side of the base section 6 shown in FIG. 2 is defined as the side seen on the right when looking at the base section 6 from the front side whereas the left side of the base section 6 shown in FIG. 2 is defined as the side seen on the left when looking at the base section 6 from the front side.

On the front side of the base section 6, a front-side attachment section 8 is provided to serve as a first engaging section. The front-side attachment section 8 is provided in such a way that the front-side attachment section 8 can be rotated about a first axis line A1 extended in the horizontal direction of the width of the tablet-terminal main body 2 relative to the lower portion of the rear surface 2c of the tablet-terminal main body 2 in an erected state.

At positions behind the front-side attachment section 8 of the base section 6, a plurality of support sections 10 are provided. Typically, three support sections 10 each having a plate shape are provided. The support leg sections 10 are provided in such a way that the support leg sections 10 can be rotated about a second axis line A2 extended in a direction parallel to the first axis line A1 relative to the base section 6.

Each of the support leg sections 10 can be rotated about the second axis line A2 between a folded position P (P1, P2, P3), at which the support leg section is folded to the base section 6, and a support position Q (Q1, Q2, Q3) (see FIG. 8-14), at which the support leg section is erected from the base section 6. The folded positions P (that is, the folded positions P1, P2 and P3) as well as the support positions Q (that is, the support positions Q1, Q2 and Q3) will be described later in detail.

On the rear side of the base section 6, a rear-side attachment section 18 is provided to serve as a second engaging section at a position corresponding to the front-side attachment section 8 and separated from the front-side attachment section 8 in the front-to-rear direction.

The support leg sections 10 includes a first support leg section 12 serving as a first leg section, a second support leg section 14 serving as a second leg section, and a third support leg section 16 serving as a third leg section. With the support leg sections 12, 14 and 16 placed at the folded positions P1, P2 and P3, respectively, the support leg sections 12, 14 and 16 are integrated with the base section 6 with the entire upper surfaces thereof forming the same plane as the upper surface 6a of the base section 6 so that a substantially rectangular shape is seen in a top view.

In other words, the first support leg section 12 is provided in such a way that, at the folded position P1, the first support leg section 12 is located on the same plane as the upper surface 6a of the base section 6 and can be engaged inside an attachment hole 6b formed at the center of the upper surface 6a of the base section 6. The first support leg section 12 is formed to have the greatest vertical direction length H1 and the greatest horizontal direction length L1 among the support leg sections 10. The attachment hole 6b of the base section 6 is an accommodation section for accommodating the support leg sections 12, 14 and 16 in a state of being rotated to the folded positions P1, P2 and P3, respectively.

In addition, the second support leg section 14 is provided in such a way that, the second support leg section 14 can be engaged inside a first hole 12a formed to have an almost rectangular shape in a planar view on the inner side of the first support leg section 12. The second support leg section 14 is formed to have a vertical direction length H2 smaller than the vertical direction length H1 of the first support leg section 12 and a horizontal direction length L2 smaller than horizontal direction length L1 of the first support leg section 12.

The third support leg section 16 is provided in such a way that the third support leg section 16 can be engaged inside a second hole 14a formed to have an almost rectangular shape in a planar view on the inner side of the second support leg section 14. The third support leg section 16 is formed to have a vertical direction length H3 smaller than the vertical direction length H2 of the second support leg section 14 and a horizontal direction length L3 smaller than horizontal direction length L2 of the second support leg section 14. At least one of the first support leg section 12, the second support leg section 14, and the third support leg section 16 can be selectively erected from the folded position P to the support position Q in order to support the tablet-terminal main body 2 at one of a plurality of inclination angles formed by the tablet-terminal main body 2 and the base section 6.

Figure 3:
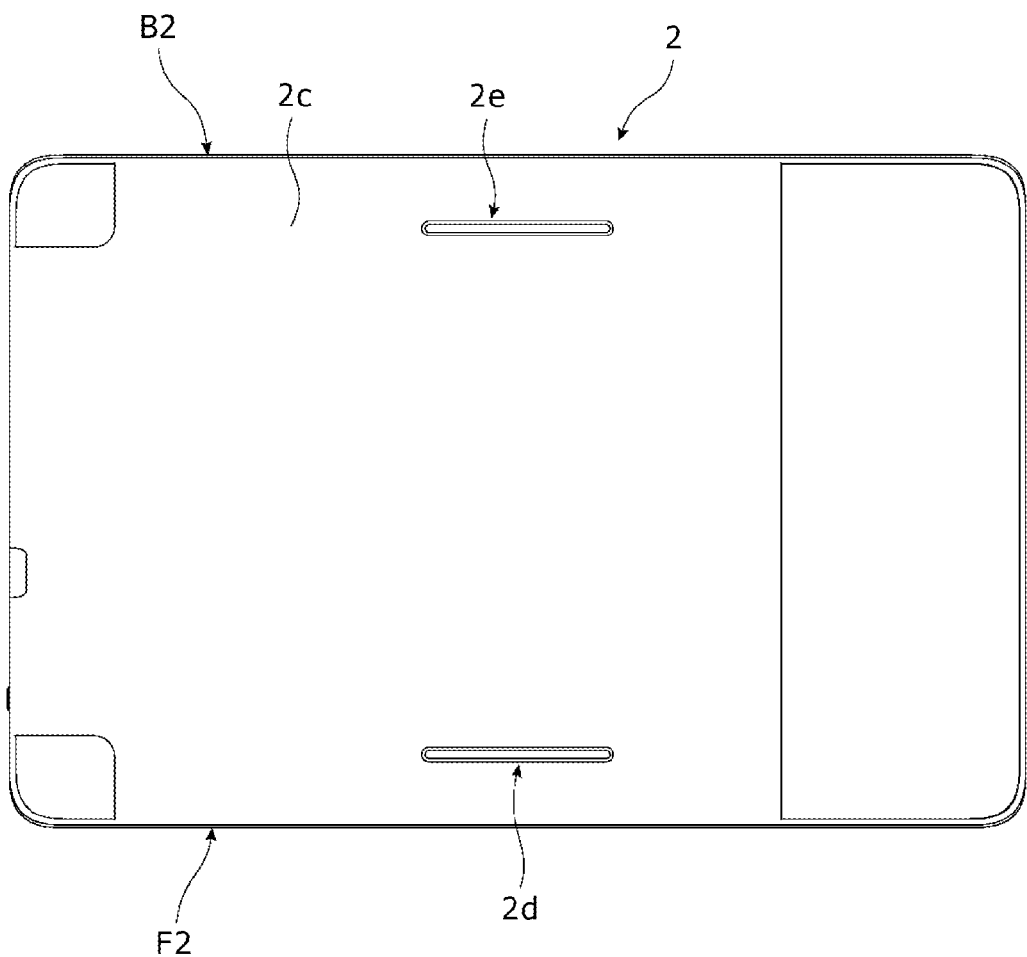
FIG. 3 is a rear view of the tablet-terminal main body, to which the stand according to the embodiment of the present invention is attached.
Figure 4:
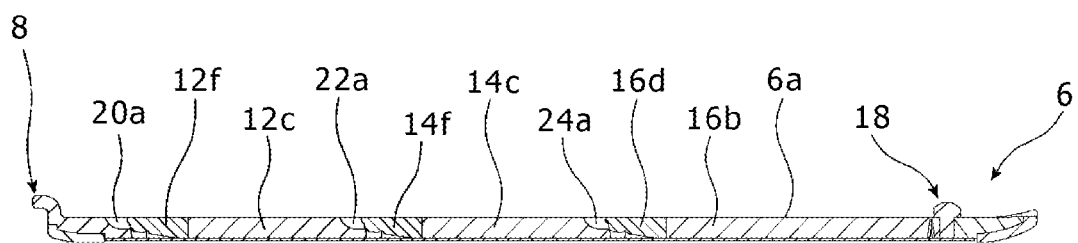
FIG. 4 is a cross-sectional side view of the stand cut along line IV-IV of FIG. 2.

FIG. 3 is a rear view of the tablet-terminal main body, to which the stand according to the embodiment of the present invention is attached. FIG. 4 is a cross-sectional view of the stand taken along line IV-IV of FIG. 2. It is to be noted that, in FIG. 3, the front and rear sides of the tablet-terminal main body 2 are denoted by notations F2 and B2, respectively. On the other hand, the left side of the tablet-terminal main body 2 shown in FIG. 3 is defined as the side seen on the "right" when looking at the tablet-terminal main body 2 from the front side, whereas the right side of the tablet-terminal main body 2 shown in FIG. 3 is defined as the side seen on the "left" when looking at the tablet-terminal main body 2 from the front side.

As shown in FIGS. 2 to 4, the front-side attachment section 8 protrudes in the upward direction from the front edge of the upper surface 6a of the base section 6, forming a horizontally long hook protruding in the forward direction from the upper edge thereof. On the rear surface 2c of the tablet-terminal main body 2, a first attachment hole 2d serving as a first engaged section and a second attachment hole 2e serving as a second engaged section are provided. Each of the first and second engaged sections is formed to have the shape of a horizontally long slit extended in the horizontal width direction of the rear surface 2c of the tablet-terminal main body 2. The first and second engaged sections are arranged in parallel to each other and placed at locations separated from each other in the vertical (length) direction of the rear surface 2c of the tablet-terminal main body 2. In addition, the first attachment hole 2d and the second attachment hole 2e are so formed that the front-side attachment section 8 can be inserted into either one of them. The front-side attachment section 8 is inserted into either the first attachment hole 2d or the second attachment hole 2e on the rear surface 2c of the tablet-terminal main body 2, and is hooked thereon so that the base section 6 can be detachably mounted on the tablet-terminal main body 2.

The first attachment hole 2d and the second attachment hole 2e on the rear surface 2c of the tablet-terminal main body 2 can be swapped with each other with regard to the locations relative to the front-side attachment section 8 of the base section 6 by rotating the tablet-terminal main body 2, before attaching the base section 6, in the same plane as the rear surface 2c of the tablet-terminal main-body 2.

Figure 7:
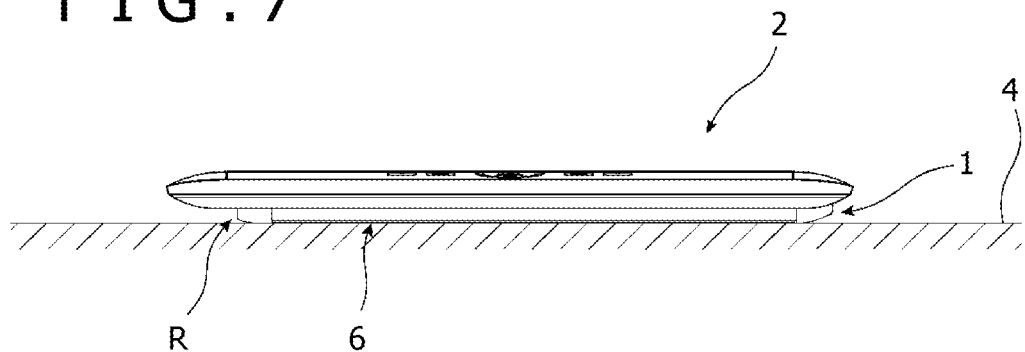
FIG. 7 is a right side view showing a state in which the stand according to the embodiment of the present invention is attached to the tablet-terminal main body in the first usage state of the stand by setting the first support leg section, the second support leg section and the third support leg section to their respective folded positions.

As will be described later in detail in reference to FIG. 7, the base section 6 is provided in such a way that, in a state after the front-side attachment section 8 is attached to the rear surface 2c of the tablet-terminal main body 2, the first to third support leg sections 12, 14 and 16 can be rotated about the first axis line A1 to their respective accommodation positions R, at which the upper surface 6a of the base section 6 is almost parallel to the rear surface 2c of the tablet-terminal main body 2. With the base section 6 located at the accommodation position R, the support leg sections 12, 14 and 16 are located at their respective folded positions P and accommodated between the rear surface 2c of the tablet-terminal main body 2 and the base section 6.

As shown in FIGS. 2 to 4, on the rear side of the upper surface 6a of the base section 6, the rear-side attachment section 18 is provided at a position corresponding to the front-side attachment section 8 and separated from the front-side attachment section 8 in the front-to-rear direction. In a first usage state, with the base section 6 located at the accommodation position R (see FIG. 7), the rear-side attachment section 18 is inserted into the second attachment hole 2e on the rear surface 2c of the tablet-terminal main body 2 so that the stand 1 is attached to the tablet-terminal main body 2. As used herein, the first usage state is a state in which the front-side attachment section 8 is attached to the first attachment hole 2d of the tablet-terminal main body 2.

In a second usage state, on the other hand, with the base section 6 located at the accommodation position R, the rear-side attachment section 18 is inserted into the "first" attachment hole 2d on the rear surface 2c of the tablet-terminal main body 2 so that the stand 1 is attached to the tablet-terminal main body 2. As used herein, the second usage state is a state in which the front-side attachment section 8 is attached to the second attachment hole 2e of the tablet-terminal main body 2.

Figure 5:
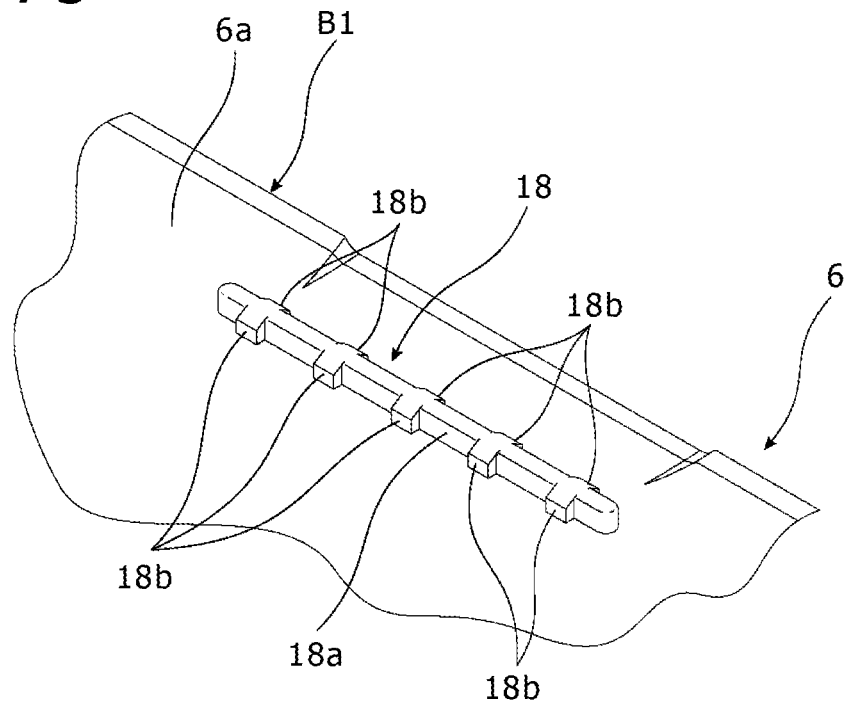
FIG. 5 is an enlarged perspective partial view of a rear-side attachment section of the stand according to the embodiment of the present invention shown in FIG. 2.

FIG. 5 is an enlarged perspective partial view of the rear-side attachment section 18 of the stand 1 according to the embodiment of the present invention shown in FIG. 2.

The surface of the rear-side attachment section 18 is formed of a mat finished material or a slippery resistant material such as a rubber. As shown in FIGS. 2, 3 and 5, the rear-side attachment section 18 protrudes in the upward direction from the upper surface 6a of the base section 6. The rear-side attachment section 18 includes a long protrusion 18a having a horizontally-long shape and a plurality of short protrusions 18b. The long protrusion 18a is formed and extended in a direction parallel to the longitudinal directions of the front-side attachment section 8 and of the first and second attachment holes 2d and 2e each having the shape of a horizontally long slit. Each of the short protrusions 18b is integrally formed with the long protrusion 18a and protrudes in the forward or backward direction from the front or rear side of the long protrusion 18a. In the first usage state, the long protrusion 18a and the short protrusions 18b are inserted into the second attachment hole 2e and engaged with the second attachment hole 2e in such a way that the rear-side attachment section 18 and the second attachment hole 2e are reliably locked to each other. Similarly, in the second usage state, the long protrusion 18a and the short protrusions 18b are inserted into the first attachment hole 2d and engaged with the first attachment hole 2d in such a way that the rear-side attachment section 18 and the second attachment hole 2e are reliably locked to each other.

Figure 6:
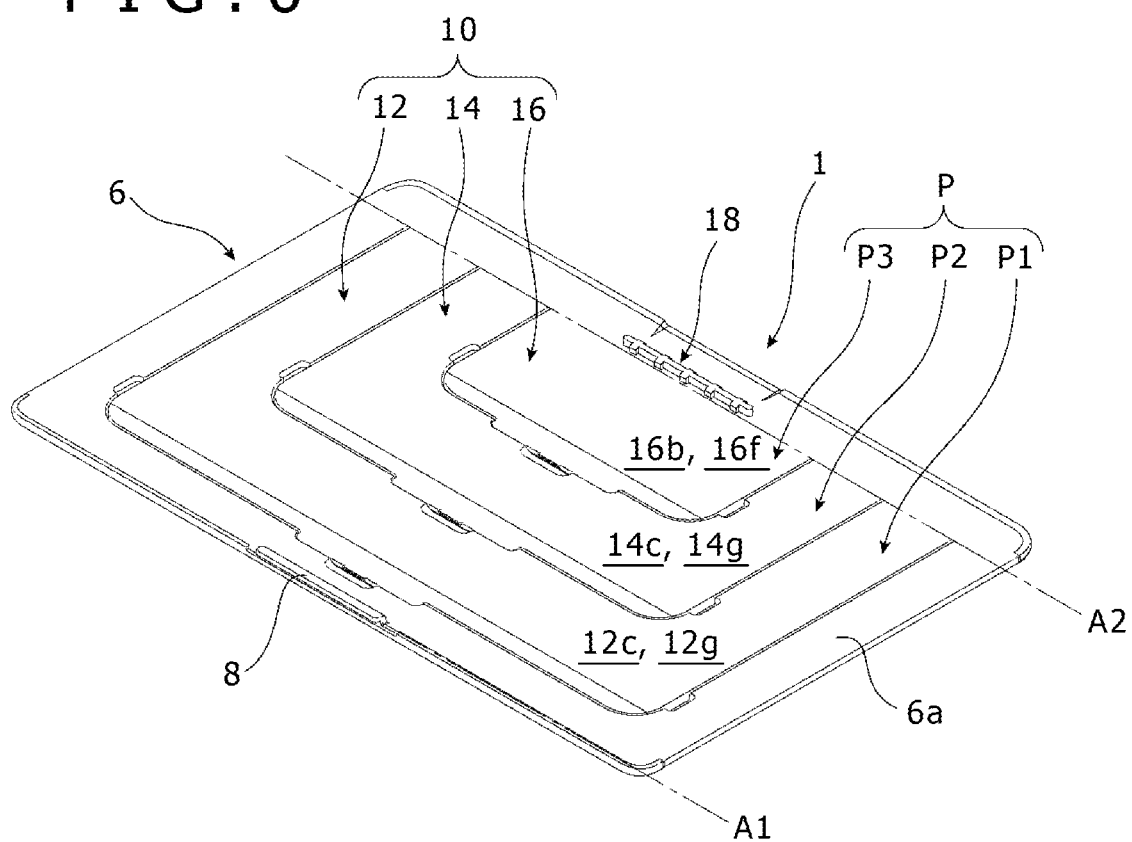
FIG. 6 is a perspective view showing the stand in a state, in which a first support leg section, a second support leg section, and a third support leg section are set to their respective folded positions in a first usage state of the stand according to the embodiment of the present invention.

FIG. 6 is a perspective view showing a state in which the first support leg section 12, the second support leg section 14, and the third support leg section 16 are set to their respective folded positions P in the first usage state of the stand 1 according to the embodiment of the present invention. FIG. 7 is a right side view showing a state in which the stand 1 according to the embodiment of the present invention is attached to the tablet-terminal main body 2 in the first usage state of the stand 1 by setting the first support leg section 12, the second support leg section 14, and the third support leg section 16 to their respective folded positions.

Figure 8:
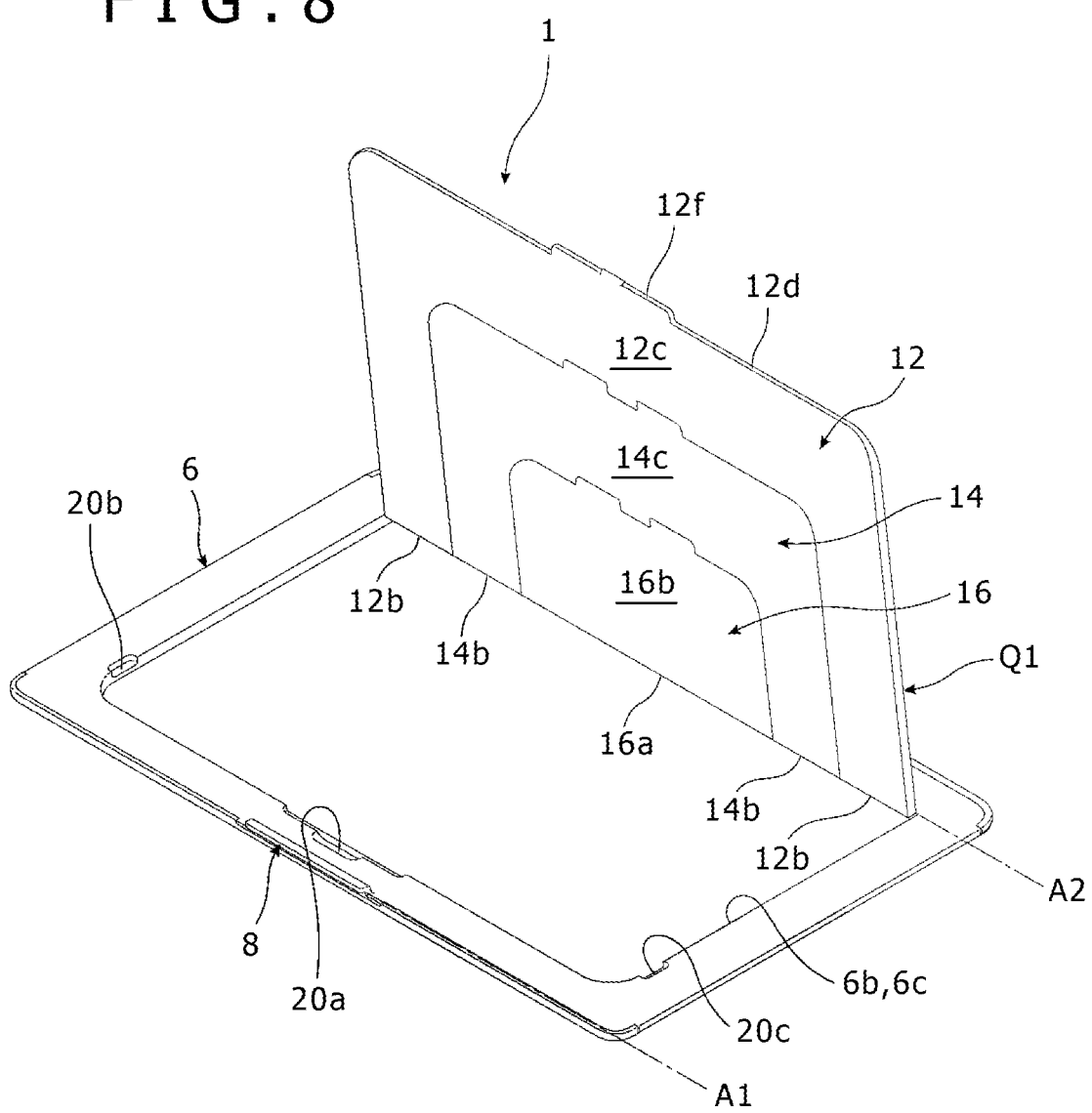
FIG. 8 is a perspective view showing the stand in a state in which the first support leg section, the second support leg section, and the third support leg section are set to their respective first support positions, in the first usage state of the stand according to the embodiment of the present invention.
Figure 9:
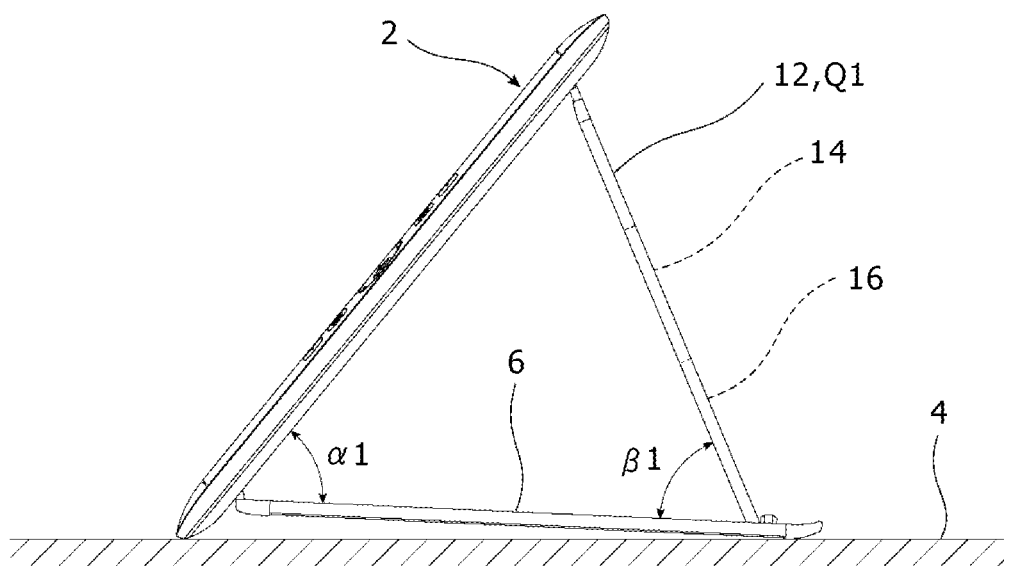
FIG. 9 is a right side view showing a state in which the stand according to the embodiment of the present invention is attached to the tablet-terminal main body in the first usage state of the stand, with the first support leg section, the second support leg section, and the third support leg section set to their respective first support positions.
Figure 10:
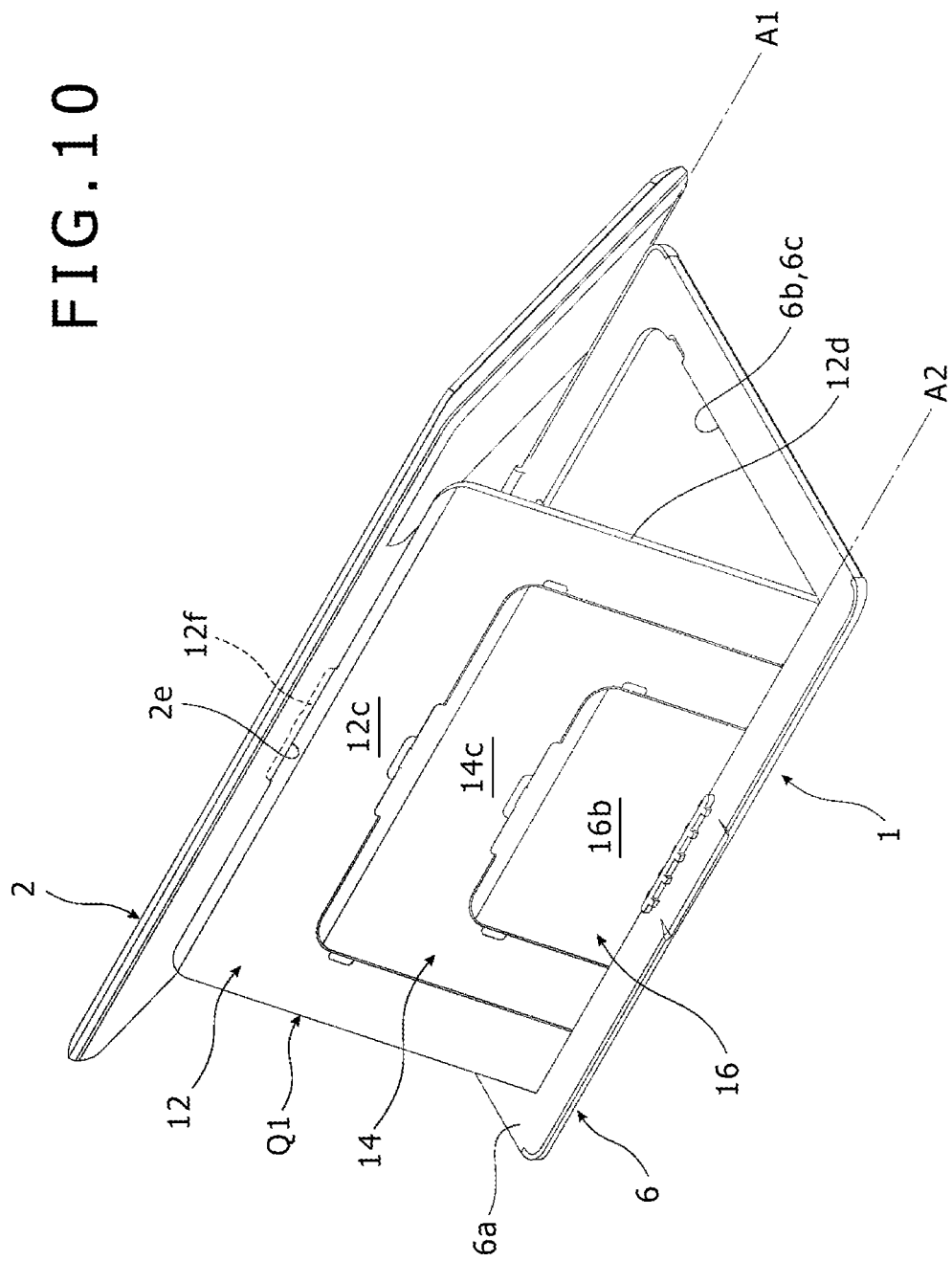
FIG. 10 is a perspective view showing the stand seen obliquely from the rear side, in which the stand according to the embodiment of the present invention is attached to the tablet-terminal main body in the first usage state of the stand, with the first support leg section, the second support leg section and the third support leg section set to their respective first support positions.

FIG. 8 is a perspective view showing a state in which the first support leg section 12, the second support leg section 14, and the third support leg section 16 are set to their respective first support positions in the first usage state of the stand 1 according to the embodiment of the present invention. FIG. 9 is a right side view showing a state in which the stand 1 according to the embodiment of the present invention is attached to the tablet-terminal main body 2 in the first usage state of the stand 1 by setting the first support leg section 12, the second support leg section 14, and the third support leg section 16 to their respective first support positions. FIG. 10 is a perspective view showing the stand 1 seen obliquely from the rear side, in which the stand 1 according to the embodiment of the present invention is attached to the tablet-terminal main body 2 in the first usage state of the stand 1 by setting the first support leg section 12, the second support leg section 14, and the third support leg section 16 to their respective first support positions.

Figure 11:
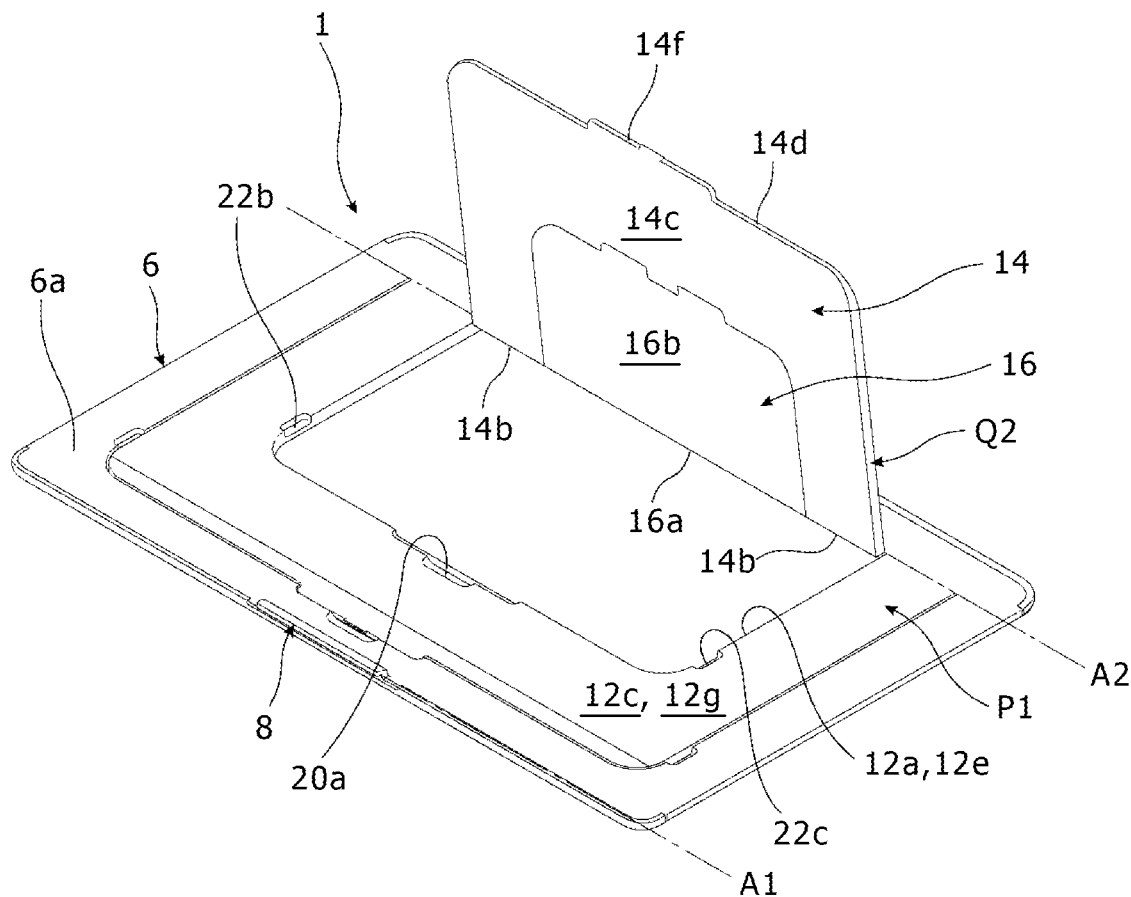
FIG. 11 is a perspective view showing a state in which the first support leg section is set to the folded position whereas the second support leg section and the third support leg section are set to their respective second support positions, in the first usage state of the stand according to the embodiment of the present invention.
Figure 12:
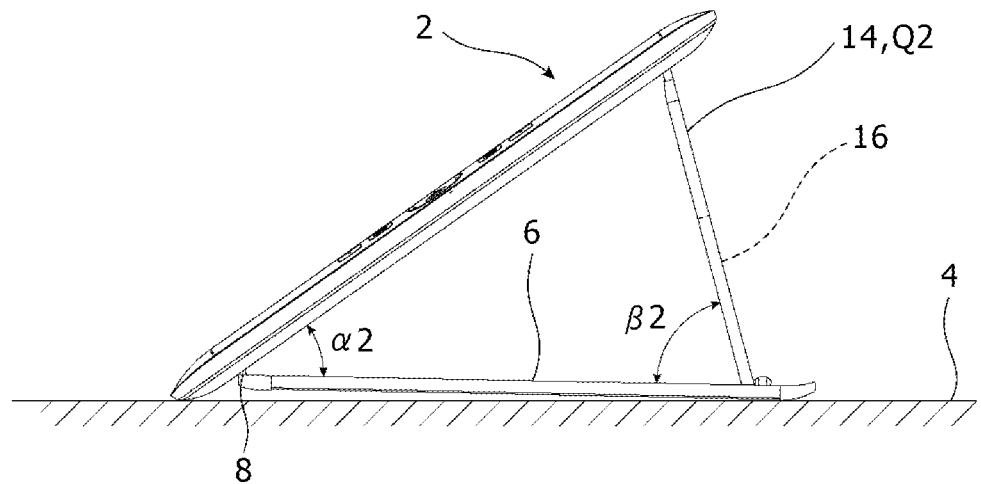
FIG. 12 is a right side view showing a state in which the stand according to the embodiment of the present invention is attached to the tablet-terminal main body in the first usage state of the stand, with the first support leg section set to the folded position while setting the second support leg section and the third support leg section to their respective second support positions.

FIG. 11 is a perspective view showing a state in which the first support leg section 12 is set to the folded position P1 whereas the second support leg section 14 and the third support leg section 16 are set to their respective second support positions in the first usage state of the stand 1 according to the embodiment of the present invention. FIG. 12 is a right side view showing a state in which the stand 1 according to the embodiment of the present invention is attached to the tablet-terminal main body 2 in the first usage state of the stand 1 by setting the first support leg section 12 to the folded position P1 while setting the second support leg section 14 and the third support leg section 16 to their respective second support positions.

Figure 13:
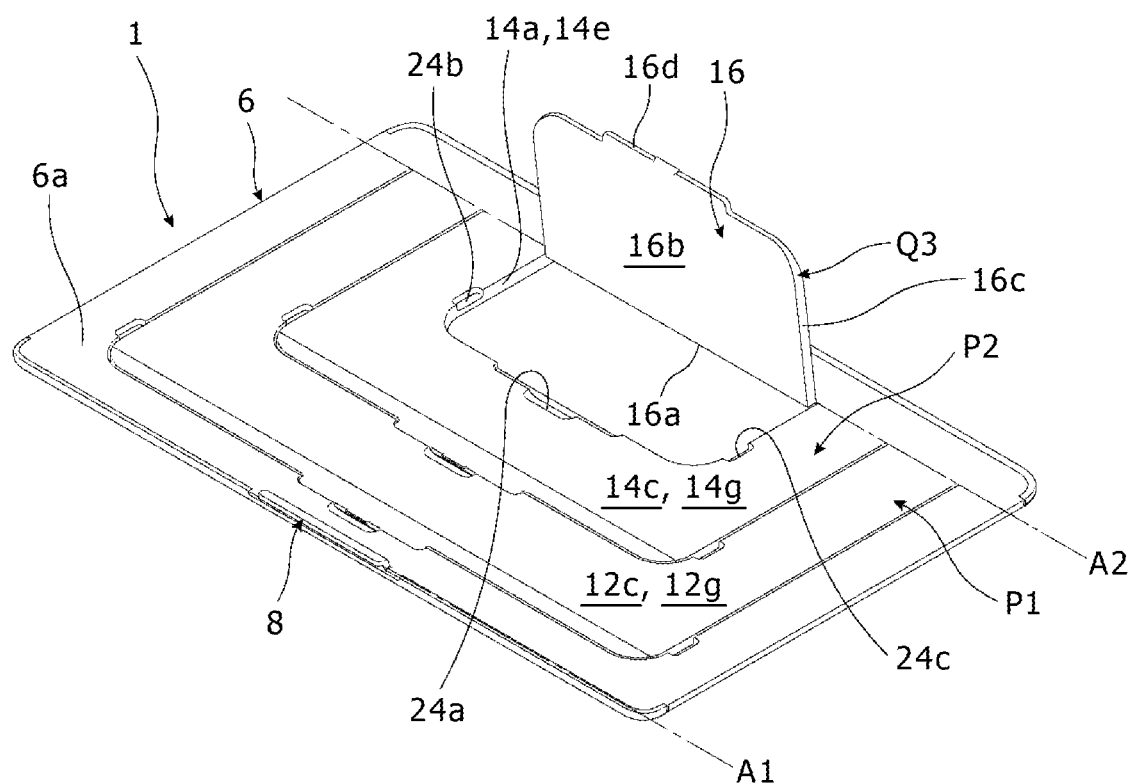
FIG. 13 is a perspective view showing a state in which the first support leg section and the second support leg section are set to their respective folded positions whereas the third support leg section is set to a third support position, in the first usage state of the stand according to the embodiment of the present invention.
Figure 14:
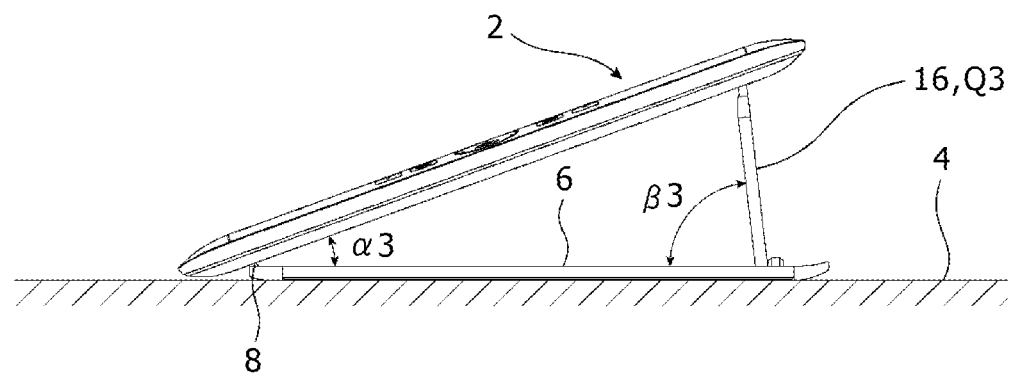
FIG. 14 is a right side view showing a state in which the stand according to the embodiment of the present invention is attached to the tablet-terminal main body in the first usage state of the stand, with the first support leg section and the second support leg section set to their respective folded positions while setting the third support leg section to the third support position.

FIG. 13 is a perspective view showing a state in which the first support leg section 12 and the second support leg section 14 are set to their respective folded positions P1 and P 2 whereas the third support leg section 16 is set to a third support position in the first usage state of the stand 1 according to the embodiment of the present invention. FIG. 14 is a right side view showing a state in which the stand 1 according to the embodiment of the present invention is attached to the tablet-terminal main body 2 in the first usage state of the stand 1 by setting the first support leg section 12 and the second support leg section 14 to their respective folded positions P1 and P2 while setting the third support leg section 16 to the third support position.

As shown in FIGS. 2, 6 and 8 to 14, the support leg sections 12, 14 and 16 have first hinge sections 12b, second hinge sections 14b and a third hinge section 16a, respectively. The hinge sections 12b, 14b and 16a are support sections including the common (coaxial) second axis line A2, which is formed on the rear side of the upper surface 6a of the base section 6 and integrated with the rear side.

The support leg sections 12, 14 and 16 also have a first leg plate section 12c, a second leg plate section 14c, and a third leg plate section 16b, respectively. At the folded positions P1, P2 and P3 of the support leg sections 12, 14 and 16, respectively, the support leg sections 12, 14 and 16 are laid on the same plane as the upper surface 6a of the base section 6 as shown in FIG. 6. By rotating the support leg sections 12, 14 and 16 from the folded positions P1, P2 and P3 to the support positions Q1, Q2 and Q3 of the support leg sections 12, 14 and 16, respectively, about the second axis line A2 of the hinge sections 12b, 14b and 16a as the axial center of the rotation in the backward direction as shown in FIG. 8, the leg plate sections 12c, 14c and 16b support the tablet-terminal main body 2 erected on the base section 6 in a direction inclined with respect to the base section 6.

The hinge sections 12b, 14b and 16a are flexible and elastically bias to press the leg plate sections 12c, 14c and 16b, respectively, in the directions from the support positions Q1, Q2 and Q3 to the folded positions P1, P2 and P3, respectively.

The surface of the first leg plate section 12c of the first support leg section 12 is formed of a mat finished material or a slippery resistant material such as a rubber. As shown in FIG. 2, the first leg plate section 12c of the first support leg section 12 has a first outer edge 12d and a first inner edge 12e. The first outer edge 12d is an edge to be engaged with the attachment hole 6b of the base section 6 at the folded position P1 in the downward direction. The first inner edge 12e is an edge formed on a side interior to the first outer edge 12d and forms a portion of the first hole 12a.

Similarly, the surface of the second leg plate section 14c of the second support leg section 14 is formed of a mat finished material or a slippery resistant material such as a rubber. As shown in FIG. 2, the second leg plate section 14c of the second support leg section 14 has a second outer edge 14d and a second inner edge 14e. The second outer edge 14d is an edge to be engaged with the first inner edge 12e of the first leg plate section 12c at the folded position P2 in the downward direction. The second inner edge 14e is an edge formed on a side interior to the second outer edge 14d and forms a portion of the second hole 14a.

Similarly, the surface of the third leg plate section 16b of the third support leg section 16 is formed of a mat finished material or a slippery resistant material such as a rubber. As shown in FIG. 2, the third leg plate section 16b of the third support leg section 16 has a third outer edge 16c. The third outer edge 16c is an edge to be engaged with the second inner edge 14e of the second leg plate section 14c at the folded position P3 in the downward direction.

In the first usage state, the front edges of the outer edges 12d, 14d and 16c of the leg plate sections 12c, 14c and 16b respectively form a first protrusion 12f, a second protrusion 14f, and a third protrusion 16d, respectively. The first usage state is a state in which the front-side attachment section 8 is attached to the first attachment hole 2d of the tablet-terminal main body 2. The first protrusion 12f, the second protrusion 14f, and the third protrusion 16d are lock sections to be attached to the second attachment hole 2e of the tablet-terminal main body 2 respectively at the support position Q1 in the state shown in FIG. 9, the support position Q2 in the state shown in FIG. 12, and the support position Q3 in the state shown in FIG. 14. Thus, one of the first protrusion 12f of the first leg plate section 12c for the support position Q1, the second protrusion 14f of the second leg plate section 14c for the support position Q2 and the third protrusion 16d of the third leg plate section 16b for the support position Q3 can be selected and the selected one can be inserted into the second attachment hole 2e of the tablet-terminal main body 2 to attach the selected one to the tablet-terminal main body 2. In this way, the magnitude of the inclination angle formed by the tablet-terminal main body 2 and the base section 6 can be set to $\alpha 1$, $\alpha 2$ or $\alpha 3$, which are angles having different values within a range of 0 to 90 degrees.

As shown in FIG. 6, in a state in which the first support leg section 12, the second support leg section 14, and the third support leg section 16 are all set to the folded position P1, the folded position P2, and the folded position P3, respectively, the magnitudes of the inclination angles $\beta 0$ formed by the upper surface 6a of the base section 6 and the upper surfaces 12g, 14g and 16f of the leg plate sections 12c, 14c and 16b, respectively, are 0 degrees whereas the magnitude of the inclination angle $\alpha 0$ formed by the tablet-terminal main body 2 and the base section 6 is also 0 degrees.

As shown in FIG. 2, at the outer peripheral portion forming the upper surface 6a of the base section 6, a portion of the inner edge 6c of the base section 6 includes dents 20a, 20b and 20c. The inner edge 6c is an edge formed in the inner periphery of the outer peripheral portion as an edge to be engaged with the first outer edge 12d of the first leg plate section 12c. The dents 20a, 20b and 20c are thus a plurality of cutout portions 20 each serving as a finger insertion portion. Each of the cutout portions 20 is a dent formed in the downward direction from the upper surface 6a of the inner edge 6c of the base section 6 in such a way that a finger of the user can be inserted into the dent. The dent 20a, which is one of the dents 20a, 20b and 20c, is provided on the inner edge 6c extended in the left-right direction (or the horizontal width direction) of the base section 6 facing the first protrusion 12f serving as the front edge of the first leg plate section 12c at the folded position P1. On the other hand, the dents 20b and 20c are provided respectively on the left and right inner edges 6c extended in the front-rear direction (or the vertical length direction) of the base section 6 to be engaged with the first outer edge 12d extended in the front-rear direction of the first leg plate section 12c at the folded position P1

Similarly, as shown in FIGS. 2 and 11, a portion of the first inner edge 12e of the first leg plate section 12c includes dents 22a, 22b and 22c. The first inner edge 12e is an edge formed in the inner periphery as an edge to be engaged with the second outer edge 14d of the second leg plate section 14c. The dents 22a, 22b and 22c are thus a plurality of cutout portions 22 each serving as a finger insertion portion. Each of the cutout portions 22 is a dent formed in the downward direction from the upper surface 12g of the first inner edge 12e of the first leg plate section 12c in such a way that that a finger of the user can be inserted into the dent. The dent 22a, which is one of the dents 22a, 22b and 22c, is provided on the first inner edge 12e extended in the left-right direction (or the horizontal width direction) of the first leg plate section 12c facing the second protrusion 14f serving as the front edge of the second leg plate section 14c at the folded position P2. On the other hand, the dents 22b and 22c are provided respectively on the left and right inner edges 12e stretched in the front-rear direction (or the vertical length direction) of the first leg plate section 12c to be engaged with the second outer edge 14d stretched in the front-rear direction of the second leg plate section 14c at the folded position P2.

Similarly, as shown in FIGS. 2 and 13, a portion of the second inner edge 14e of the second leg plate section 14c includes dents 24a, 24b and 24c. The second inner edge 14e is an edge formed in the inner periphery as an edge to be engaged with the third outer edge 16c of the third leg plate section 16b. The dents 24a, 24b and 24c are thus a plurality of cutout portions 24 each serving as a finger insertion portion. Each of the cutout portions 24 is a dent formed in the downward direction from the upper surface 14g of the second inner edge 14e of the second leg plate section 14c in such a way that that a finger of the user can be inserted into the dent. The dent 24a, which is one of the dents 24a, 24b and 24c, is provided on the second inner edge 14e extended in the left-right direction (or the horizontal width direction) of the second leg plate section 14c facing the third protrusion 16d serving as the front edge of the third leg plate section 16b at the folded position P3. On the other hand, the dents 24b and 24c are provided respectively on the left and right second inner edges 14e extended in the front-rear direction (or the vertical length direction) of the second leg plate section 14c to be engaged with the third outer edge 16c extended in the front-rear direction of the third leg plate section 16b at the folded position P3.

As shown in FIGS. 8 to 10, in a state in which the first support leg section 12 is set to the support position Q1, with respect to the base section 6, the first support leg section 12, the second support leg section 14, and the third support leg section 16 are all rotated as an integrated unit with the second axis line A2 used as the axial center of the rotation to raise the first support leg section 12, the second support leg section 14, and the third support leg section 16. At this time, the first protrusion 12f of the first leg plate section 12c of the first support leg section 12 is selected and attached to the second attachment hole 2e of the tablet-terminal main body 2. Thus, the magnitude of the inclination angle β1 formed by the upper surface 6a of the base section 6 and the upper surfaces 12g, 14g and 16f of the leg plate sections 12c, 14c and 16b of the support leg sections 12, 14 and 16, respectively, is greater than 0 degrees but smaller than 90 degrees, and the magnitude of the inclination angle α1 formed by the tablet-terminal main body 2 and the base section 6 is maximized.

As shown in FIGS. 11 and 12, in a state in which the first support leg section 12 is set to the folded position P1 whereas the second support leg section 14 and the third support leg section 16 are set to the support position Q2, with respect to the base section 6, the second support leg section 14 and the third support leg section 16 are rotated as an integrated unit with the second axis line A2 used as the axial center of the rotation to raise the second support leg section 14 and the third support leg section 16. At this time, the second protrusion 14f of the second leg plate section 14c of the second support leg section 14 is selected and attached to the second attachment hole 2e of the tablet-terminal main body 2. Thus, the magnitude of the inclination angle β0 formed by the upper surface 6a of the base section 6 and the upper surface 12g of the first leg plate section 12c is 0 degrees. However, the magnitude of the inclination angle β2 formed by the upper surface 6a of the base section 6 and the upper surfaces 14g and 16f of the second leg plate section 14c and the third leg plate section 16b, respectively, is greater than the inclination angle β1, which is greater than 0 degrees but smaller than 90 degrees. On the other hand, the magnitude of the inclination angle α2 formed by the tablet-terminal main body 2 and the base section 6 is greater than 0 degrees but smaller than the maximum inclination angle α1.

As shown in FIGS. 13 and 14, in a state in which the first support leg section 12 and the second support leg section 14 are set to the folded position P1 and the folded position P2, respectively, whereas the third support leg section 16 is set to the support position Q3, with respect to the base section 6, only the third support leg section 16 is rotated with the second axis line A2 used as the axial center of the rotation to raise the third support leg section 16. At this time, the third protrusion 16d of the third leg plate section 16b is selected and attached to the second attachment hole 2e of the tablet-terminal main body 2. Thus, the magnitude of the inclination angle β0 formed by the upper surface 6a of the base section 6 and the upper surfaces 12g and 14g of the first leg plate section 12c and the second leg plate section 14c is 0 degrees. However, the magnitude of the inclination angle β3 formed by the upper surface 6a of the base section 6 and the upper surface 16f of the third leg plate section 16b is greater than 0 degrees and greater than the inclination angle β2. On the other hand, the magnitude of the inclination angle α3 formed by the tablet-terminal main body 2 and the base section 6 is greater than 0 degrees but smaller than the inclination angle α2.

Figure 15:
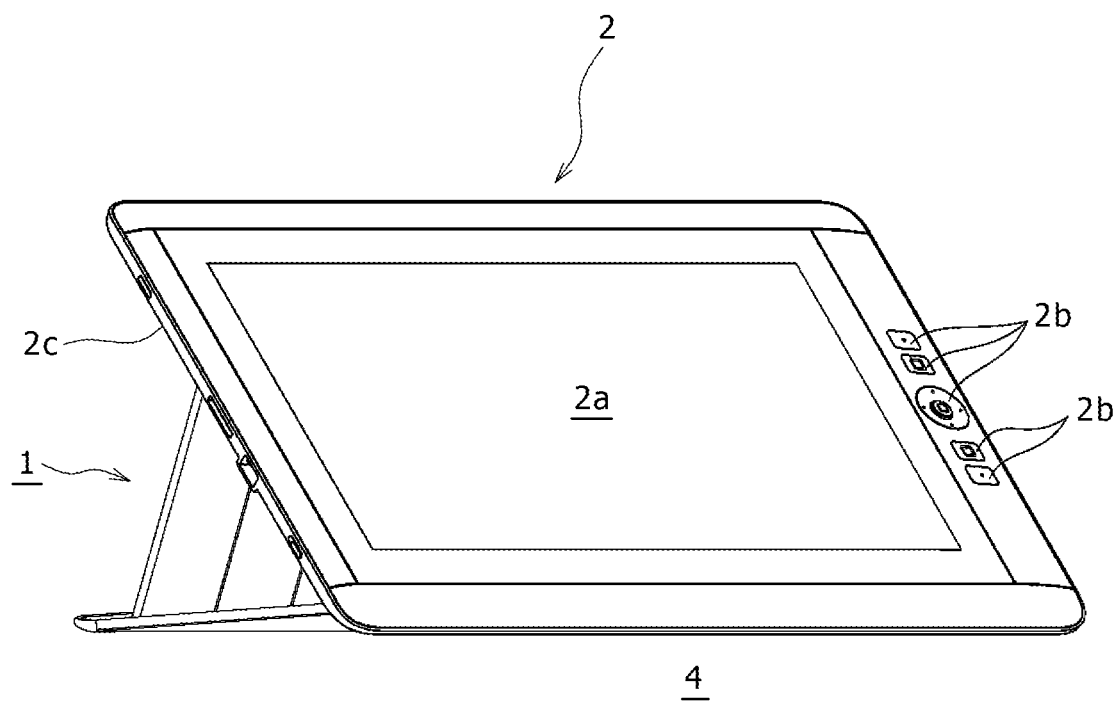
FIG. 15 is a schematic perspective view showing a state in which the stand according to the embodiment of the present invention in a second usage state supports the tablet-terminal main body from a rear side of the main body, as seen obliquely from a front side of the main body.

FIG. 15 is a schematic perspective view showing a state, in which the stand according to the embodiment of the present invention in a second usage state supports the tablet-terminal main body from a rear side of the main body, as seen obliquely from a front side of the main body.

As shown in FIGS. 3 and 15, in a state in which the front-side attachment section 8 is attached to the second attachment hole 2e of the rear surface 2c of the tablet-terminal main body 2 (i.e., in the second usage state), if one of the first protrusion 12f of the first support leg section 12, the second protrusion 14f of the second support leg section 14, and the third protrusion 16d of the third support leg section 16 is attached to the first attachment hole 2d of the rear surface 2c of the tablet-terminal main body 2, the locations of the operation buttons 2b and the liquid-crystal display section 2a of the tablet-terminal main body 2 are in a state of being rotated by 180 degrees around a rotational axis line that extends from the front to rear surfaces of the tablet-terminal main body 2 in the vertical direction, with respect to the locations of the operation buttons 2b and the liquid-crystal display section 2a of the tablet-terminal main body 2 as shown in FIG. 1. Then, the tablet-terminal main body 2 is supported in a state of being inclined with respect to the base section 6 placed on the upper surface 4 of the table.

In accordance with the stand 1 according to the embodiment of the present invention described above, in a state in which the front-side attachment section 8 of the base section 6 is provided in such a way that the front-side attachment section 8 can be rotated about the first axis line A1 stretched in the horizontal width direction of the tablet-terminal main body 2, a plurality of support leg sections 12, 14 and 16 rotatable about the second axis line A2 stretched in a direction parallel to the first axis line A1 are rotated with respect to the base section 6 about the second axis line A2 to be in the folded positions P1, P2 and P3, respectively, to firmly fix the protrusions 12f, 14f and 16d, which are the edges of the support leg sections 12, 14 and 16 respectively, on the rear surface 2c of the tablet-terminal main body 2. Thus, the support leg sections 12, 14 and 16 can be folded on the base section 6 to reliably and easily accommodate the support leg sections 12, 14 and 16 between the tablet-terminal main body 2 and the base section 6. In addition, it is possible to set the total thickness of the tablet-terminal main body 2 and the base section 6 attached to the rear surface 2c of the tablet-terminal main body 2 to a small value. As a result, the tablet-terminal main body 2 can be easily carried with the support leg sections accommodated between the tablet-terminal main body 2 and the base section 6. Thus, the present invention provides the tablet-terminal main body 2 with a high degree of usability.

In addition, at least one of the support leg sections 12, 14 and 16, which have lengths different from each other, is rotated about the second axis line A2 to the support position Q in order to selectively raise the support leg section 12, 14 or 16 relative to the base section 6. In this way, one of the protrusions 12f, 14f and 16d of the support leg sections 12, 14 and 16 can be firmly attached to either one of the first attachment hole 2d or the second attachment hole 2e. The first attachment hole 2d and the second attachment hole 2e are holes provided on the rear surface 2c of the tablet-terminal main body 2 to serve as fixing means. Thus, the inclination angles α1, α2 and α3 formed by the base section 6 and the tablet-terminal main body 2 supported by one of the support leg sections 12, 14 and 16 can be set to different values.

In particular, in a state in which the first protrusion 12f of the first support leg section 12 is selected to be attached to one of the first attachment hole 2d and the second attachment hole 2e of the tablet-terminal main body 2, the magnitude of the inclination angle formed by the base section 6 and the tablet-terminal main body 2 can be set to a maximum value greater than 0 degrees but smaller than 90 degrees. This maximum angle is referred to as a first inclination angle α1 (see FIG. 9). In addition, in a state in which the second protrusion 14f of the second support leg section 14 is selected to be attached to one of the first attachment hole 2d and the second attachment hole 2e of the tablet-terminal main body 2, the magnitude of the inclination angle formed by the base section 6 and the tablet-terminal main body 2 can be set to a second inclination angle α2 greater than 0 degrees but smaller than the magnitude of the first inclination angle α1 (see FIG. 12). Furthermore, in a state in which the third protrusion 16d of the third support leg section 16 is selected to be attached to one of the first attachment hole 2d and the second attachment hole 2e of the tablet-terminal main body 2, the inclination angle formed by the base section 6 and the tablet-terminal main body 2 can be set to a third inclination angle α3 greater than 0 degrees but smaller than the magnitude of the second inclination angle α2 (see FIG. 14). Thus, in accordance with the state in which the tablet-terminal main body 2 is used, the inclination angle formed by the base section 6 and the tablet-terminal main body 2 can be easily set to any of the inclination angles α1, α2 and α3. As a result, the present invention provides the tablet-terminal main body 2 with a high degree of usability.

In addition, in accordance with the stand 1 according to the embodiment, with the front-side attachment section 8 attached to the rear surface 2c of the tablet-terminal main body 2, the base section 6 can be rotated about the first axis line A1 until the accommodation position R almost parallel to the rear surface 2c of the tablet-terminal main body 2, so that the support leg sections 12, 14 and 16 can be accommodated between the rear surface 2c of the tablet-terminal main body 2 and the base section 6 at the accommodation position R. Thus, it is possible to set the total thickness of the tablet-terminal main body 2 and the base section 6 attached to the rear surface 2c of the tablet-terminal main body 2 to a small value. As a result, the tablet-terminal main body 2 can be easily carried with the support sections accommodated between the tablet-terminal main body 2 and the base section 6. Thus, the present invention provides the tablet-terminal main body 2 with a high degree of usability.

In addition, in accordance with the stand 1 according to the embodiment, the front-side attachment section 8 forming a horizontally long hook can be hooked on the horizontally long first attachment hole 2d or the horizontally long second attachment hole 2e, each formed on the rear surface 2c of the tablet-terminal main body 2, so that the base section 6 can be easily detachably mounted on the tablet-terminal main body 2. With the front-side attachment section 8 attached to the horizontally long first attachment hole 2d or the horizontally long second attachment hole 2e each formed on the rear surface 2c of the tablet-terminal main body 2, the base section 6 can be rotated about the first axis line A1 with respect to the rear surface 2c of the tablet-terminal main body 2. Thus, it is possible to easily set the base section 6 at the accommodation position R almost parallel to the rear surface 2c of the tablet-terminal main body 2 and to easily incline (or erect) the tablet-terminal main body 2 with respect to the base section 6. As a result, the present invention provides the tablet-terminal main body 2 with a high degree of usability.

In addition, in accordance with the stand 1 according to the embodiment, the hinge sections 12b, 14b and 16a of the support leg sections 12, 14 and 16, respectively, are integrally formed on the rear side of the upper surface 6a of the base section 6 to serve as flexible hinges for elastically biasing the leg plate sections 12c, 14c and 16b, respectively, in a direction from the support position Q to the folded position P. Thus, when the support leg sections 12, 14 and 16 are placed at the folded positions P1, P2 and P3 respectively, it is possible to reliably fix the support leg sections 12, 14 and 16 on the base section 6 in a state of the support leg sections 12, 14 and 16 being elastically biased toward the base section 6 so that the upper surfaces 12g, 14g and 16f of the support leg sections 12, 14 and 16, respectively, become coplanar with the upper surface 6a of the base section 6. Accordingly, when the support leg sections 12, 14 and 16 are inadvertently rotated about the centers of the hinge sections 12b, 14b and 16a, respectively, to the support position Q, it is possible to prevent the base section 6 from being inadvertently disengaged from the rear surface 2c of the tablet-terminal main body 2. In addition, when at least one of the support leg sections 12, 14 and 16 is placed at the support position Q, with a specific one of the protrusions 12f, 14f and 16d being fixed to the first attachment hole 2d of the rear surface 2c of the tablet-terminal main body 2 or the second attachment hole 2e of the rear surface 2c of the tablet-terminal main body 2, the raised leg plate section is pressed in a direction toward the folded position P, so that it is possible to strengthen the state of attaching the front edge portion of the support leg section to the first attachment hole 2d of the rear surface 2c of the tablet-terminal main body 2 or the second attachment hole 2e of the rear surface 2c of the tablet-terminal main body 2. As a result, it is possible to fix the tablet-terminal main body 2 inclined with respect to the base section 6 on the base section 6 in a state of stably supporting the tablet-terminal main body 2, by making use of the leg plate sections 12c, 14c and 16b of the support leg sections 12, 14 and 16. The specific one of the protrusions 12f, 14f and 16d is the front edge portion of a leg plate section raised to the highest position among all leg plate sections, which are the leg plate sections 12c, 14c and 16b.

In addition, in accordance with the stand 1 according to the embodiment, at the folded position P1, the folded position P2, and the folded position P3, respectively, the upper surface 12g of the first support leg section 12, the upper surface 14g of the second support leg section 14, and the upper surface 16f of the third support leg section 16 are laid on the same plane as the upper surface 6a of the base section 6. When the user makes an attempt to move at least one of the first support leg section 12, the second support leg section 14, and the third support leg section 16 from the folded position P1, the folded position P2, and the folded position P3 to the support position Q1, the support position Q2, and the support position Q3, respectively, the user inserts fingers into the finger-insertion dents 20, 24 and 26 provided at portions of the inner edge 6c of the base section 6 engaged with the first outer edge 12d of the first leg plate section 12c of the first support leg section 12 at the folded position P1, the second outer edge 14d of the second leg plate section 14c of the second support leg section 14 at the folded position P2, and the third outer edge 16c of the third leg plate section 16b of the third support leg section 16 at the folded position P3, in order to pick and raise the first outer edge 12d of the first leg plate section 12c, the second outer edge 14d of the second leg plate section 14c, and the third outer edge 16c of the third leg plate section 16b. Thus, the leg plate section can be easily raised with respect to the base section 6. As a result, the present invention provides the tablet-terminal main body 2 with a high degree of usability.

In particular, when the user makes an attempt to move the first support leg section 12 from the folded position P1, at which the upper surface 12g of the first leg plate section 12c of the first support leg section 12 has been laid on the same plane as the upper surface 6a of the base section 6, to the support position Q1, the user inserts finger(s) into at least one of the finger-insertion dents 20a, 20b and 20c provided at portions of the inner edge 6c of the base section 6, in order to pick and raise the first outer edge 12d of the first leg plate section 12c of the first support leg section 12 at the folded position P1. Thus, the first leg plate section 12 can be easily raised with respect to the base section 6.

Similarly, when the user makes an attempt to move the second support leg section 14 from the folded position P2, at which the upper surface 14g of the second leg plate section 14c of the second support leg section 14 has been laid on the same plane as the upper surface 6a of the base section 6, to the support position Q2, the user inserts finger(s) into at least one of the finger-insertion dents 22a, 22b and 22c provided at portions of the first inner edge 12e of the first leg plate section 12c, in order to pick and raise the second outer edge 14d of the second leg plate section 14c of the second support leg section 14 at the folded position P2. Thus, the second leg plate section 14 can be easily raised with respect to the base section 6.

In the same way, when the user makes an attempt to move the third support leg section 16 from the folded position P3, at which the upper surface 16f of the third leg plate section 16b of the third support leg section 16 has been laid on the same plane as the upper surface 6a of the base section 6, to the support position Q3, the user inserts finger(s) into at least one of the finger-insertion dents 24a, 24b and 24c provided at portions of the second inner edge 14e of the second leg plate section 14c, in order to pick and raise the third outer edge 16c of the third leg plate section 16b of the third support leg section 16 at the folded position P3. Thus, the third leg plate section 16 can be easily raised with respect to the base section 6.

In addition, in accordance with the stand 1 according to the embodiment, the first outer edge 12d of the first leg plate section 12c of the first support leg section 12, the second outer edge 14d of the second leg plate section 14c of the second support leg section 14, and the third outer edge 16c of the third leg plate section 16b of the third support leg section 16 are formed of a slippery resistant material. Thus, at the folded position P1, the folded position P2, and the folded position P3, which are positions of engagement with the base section 6, the engagement with the base section 6 is difficult to be undone and the first outer edge 12d of the first leg plate section 12c of the first support leg section 12 at the folded position P1, the second outer edge 14d of the second leg plate section 14c of the second support leg section 14 at the folded position P2, and the third outer edge 16c of the third leg plate section 16b of the third support leg section 16 at the folded position P3 can be reliably engaged with each other and attached to the base section 6. Accordingly, it is possible to prevent the base section 6 from inadvertently disengaged from the rear surface 2c of the tablet-terminal main body 2 because the first outer edge 12d of the first leg plate section 12c of the first support leg section 12 at the folded position P1, the second outer edge 14d of the second leg plate section 14c of the second support leg section 14 at the folded position P2, and the third outer edge 16c of the third leg plate section 16b of the third support leg section 16 at the folded position P3 are difficult to be inadvertently disengaged from the base section 6. Therefore, since the tablet-terminal main body 2 can be reliably attached to the base section 6, even when the tablet-terminal main body 2 is being carried by attaching the tablet-terminal main body 2 to the base section 6 for example, it is possible to prevent the base section 6 from being inadvertently disengaged from the rear surface 2c and from being inadvertently dismounted from the tablet-terminal main body 2. In addition, when at least one of the support leg sections 12, 14 and 16 is located at the support position Q1, Q2 or Q3, respectively, one of the protrusions 12f, 14f and 16d at the highest position is stably attached to the first attachment hole 2d or the second attachment hole 2e of the rear surface 2c of the tablet-terminal main body 2, so that it is possible to fix the tablet-terminal main body 2 inclined with respect to the base section 6 on the base section 6 in a state of the base section 6 stably supporting the tablet-terminal main body 2.

In addition, in accordance with the stand 1 according to the embodiment, the first attachment hole 2d and the second attachment hole 2e each having a slit shape are arranged in parallel, across the vertical length direction of the rear surface 2c of the tablet-terminal main body 2, and extended in the horizontal width direction of the rear surface 2c of the tablet-terminal main body 2. Before attaching the base section 6, if the tablet-terminal main body 2 is rotated in the plane of the rear surface 2c, the positions of the first attachment hole 2d and the second attachment hole 2e can be swapped with each other. Thus, with the front-side attachment section 8 attached to the first attachment hole 2d of the tablet-terminal main body 2, the rear-side attachment section 18 of the base section 6 or one of the first protrusion 12f of the first leg plate section 12c at the support position Q1, the second protrusion 14f of the second leg plate section 14c at the support position Q2, and the third protrusion 16d of the third leg plate section 16b at the support position Q3 can be attached to the second attachment hole 2e. Alternatively, with the front-side attachment section 8 attached to the second attachment hole 2e, the rear-side attachment section 18 or one of the first protrusion 12f of the first leg plate section 12c at the support position Q1, the second protrusion 14f of the second leg plate section 14c at the support position Q2, and the third protrusion 16d of the third leg plate section 16b at the support position Q3 can be attached to the first attachment hole 2d. Accordingly, in accordance with the state in which the tablet-terminal main body 2 is being used, it is possible to easily change the orientation of the tablet-terminal main body 2 with respect to the base section 6, the front-side attachment section 8, the rear-side attachment section 18, and the support leg sections 12, 14 and 16. As a result, the present invention provides the tablet-terminal main body 2 with a high degree of usability.

In addition, in accordance with the stand 1 according to the embodiment, when the support leg sections 12, 14 and 16 are placed at the folded positions P1, P2 and P3, respectively, the front-side attachment section 8 of the base section 6 is attached to either one of the first attachment hole 2d and the second attachment hole 2e of the rear surface 2c of the tablet-terminal main body 2, whereas the rear-side attachment section 18 of the base section 6 is attached to the other one of the first attachment hole 2d and the second attachment hole 2e of the rear surface 2c of the tablet-terminal main body 2. In such a state, the long protrusion 18a and the short protrusion 18b of the rear-side attachment section 18 are inserted to the other one of the first attachment hole 2d and the second attachment hole 2e of the rear surface 2c of the tablet-terminal main body 2 to be engaged therewith, so that the rear-side attachment section 18 can be reliably locked in the other one of the first attachment hole 2d and the second attachment hole 2e of the rear surface 2c of the tablet-terminal main body 2. Thus, since the tablet-terminal main body 2 can be reliably attached to the base section 6, even for example when the tablet-terminal main body 2 is being carried by attaching the tablet-terminal main body 2 to the base section 6, it is possible to prevent the base section 6 from being inadvertently detached from the rear surface 2c and from being inadvertently dismounted from the tablet-terminal main body 2. In addition, it is possible to make use of the base section 6 at the accommodation position R with the support leg sections at the folded positions P1, P2 and P3 as means for protecting the tablet-terminal main body 2. As a result, the present invention provides the tablet-terminal main body 2 with a high degree of usability.

In addition, in accordance with the stand 1 according to the embodiment, the rear-side attachment section 18 is formed of a slippery resistant material. Thus, at a folded position at which the rear-side attachment section 18 is attached to the other one of the first attachment hole 2d and the second attachment hole 2e of the rear surface 2c of the tablet-terminal main body 2, the base section 6 becomes difficult to be disengaged from the rear surface 2c of the tablet-terminal main body 2, so that, in a state in which the rear-side attachment section 18 of the base section 6 at the accommodation position R is attached to the other one of the first attachment hole 2d and the second attachment hole 2e of the rear surface 2c of the tablet-terminal main body 2, the tablet-terminal main body 2 can be reliably attached to the base section 6. Accordingly, since the tablet-terminal main body 2 can be reliably attached to the base section 6, even for example when the tablet-terminal main body 2 is being carried by attaching the tablet-terminal main body 2 to the base section 6, it is possible to prevent the base section 6 from being inadvertently disengaged from the rear surface 2c and from being inadvertently dismounted from the tablet-terminal main body 2.

Embodiments of the present disclosure are not limited to the foregoing embodiments, and various changes can be made without departing from the spirit of the present disclosure.

The invention claimed is:

1. A stand for supporting a rear surface of an electronic apparatus at different inclining heights to thereby change the orientation of the electronic apparatus, wherein the rear surface of the electronic apparatus includes a first engaged section and a second engaged section, the stand comprising:
   a base section composed of a plate member having a first edge and a second edge, the plate member being configured to rotationally support the electronic apparatus about a first rotational axis adjacent to the first edge and defining an area for facing the rear surface of the electronic apparatus; and
   a plurality of leg sections provided in the area defined by the plate member,
   the plurality of leg sections each including a lock section having a protrusion configured to be inserted into the second engaged section of the rear surface of the electronic apparatus, and a support section provided to rotate about a second rotational axis adjacent to the second edge of the plate member to serve as a rotational support for the leg section relative to the plate member, the plurality of leg sections sharing the second rotational axis as a common rotational axis and respectively having different distances from the second rotational axis to the protrusion.

2. The stand for an electronic apparatus according to claim 1 wherein:
   the base section includes a first engaging section adjacent to the first edge of the plate member, the first engaging section being configured to engage with the first engaged section provided on the rear surface of the electronic apparatus to form the first rotational axis.

3. The stand for an electronic apparatus according to claim 2, wherein the plate member has a rectangular shape having the first edge and the second edge that oppose each other.

4. The stand for an electronic apparatus according to claim 2, wherein the first engaging section has a hook shape.

5. The stand for an electronic apparatus according to claim 1, wherein each of the leg sections has a plate shape and is rotatable between a folded position, at which the leg section is folded to the plate member of the base section, and a support position, at which the leg section is erected from the plate member of the base section.

6. The stand for an electronic apparatus according to claim 5, wherein the base section further includes a second engaging section adjacent to the second edge of the plate member, the second engaging section being configured to engage with the second engaged section of the rear surface of the electronic apparatus when the leg sections are folded to their respective folded positions.

7. The stand for an electronic apparatus according to claim 6, wherein the second engaging section includes a protrusion configured to be inserted into the second engaged section.

8. The stand for an electronic apparatus according to claim 6, wherein the first engaging section adjacent to the first edge of the plate member is configured to engage with either one of the first and the second engaged sections provided on the rear surface of the electronic apparatus, and the second engaging section adjacent to the second edge of the plate member is configured to engage with the other one of the first and the second engaged sections.

9. The stand for an electronic apparatus according to claim 5, wherein the plate member forms an outer peripheral portion that surrounds the area, in which the plurality of leg sections are provided, and the outer peripheral portion accommodates the plurality of leg sections when folded to the folded positions so that surfaces of the plurality of leg sections become coplanar with a surface of the outer peripheral portion.

10. The stand for an electronic apparatus according to claim 5, wherein the support section of each of the leg sections forms a flexible hinge section configured to bias the leg section from its support position in a direction toward its folded position.

11. The stand for an electronic apparatus according to claim 1 wherein:
the leg sections include a first leg section, a second leg section, and a third leg section;
the first leg section has a first outer edge and a first inner edge formed on a side interior to the first outer edge;
the second leg section has a second outer edge to be engaged with the first inner edge of the first leg section and a second inner edge formed on a side interior to the second outer edge;
the third leg section has a third outer edge to be engaged with the second inner edge of the second leg section; and
each of the first, the second, and the third leg sections is rotatable between a folded position, at which the leg section is folded to the plate member of the base section, and a support position, at which the leg section is erected from the plate member of the base section.

12. The stand for an electronic apparatus according to claim 11, wherein:
when the first leg section is rotated, the second leg section is engaged with the first leg section and the third leg section is engaged with the second leg section so that the first, the second, and the third leg sections are rotated as a unit; and
when the second leg section is rotated, the third leg section is engaged with the second leg section so that the second and the third leg sections are rotated as a unit.

13. The stand for an electronic apparatus according to claim 11, wherein the plate member forms an outer peripheral portion that surrounds the area, in which the first, the second, and the third leg sections are provided, and the outer peripheral portion accommodates the first, the second, and the third leg sections when folded to their folded positions so that surfaces of the first, the second, and the third leg sections become coplanar with a surface of the outer peripheral portion.

14. The stand for an electronic apparatus according to claim 13, wherein an inner periphery of the outer peripheral portion defines a finger insertion cutout configured to receive a user finger to lift the first leg section relative to the outer peripheral portion.

15. The stand for an electronic apparatus according to claim 14, wherein the first inner edge of the first leg section defines a first finger insertion cutout configured to receive a user finger to lift the second leg section relative to the first leg section, and the second inner edge of the second leg section defines a second finger insertion cutout configured to receive a user finger to lift the third leg section relative to the second leg section.

16. The stand for an electronic apparatus according to claim 11 wherein:
when the first leg section is rotated to its support position, the protrusion of the lock section of the first leg section is inserted into the second engaged section;
when the second leg section is rotated to its support position while the first leg section is in its folded position, the protrusion of the lock section of the second leg section is inserted into the second engaged section; and
when the third leg section is rotated to its support position while the first and the second leg sections are in their respective folded positions, the protrusion of the lock section of the third leg section is inserted into the second engaged section.

17. The stand for an electronic apparatus according to claim 13, wherein an inner periphery of the outer peripheral portion defines a finger insertion cutout adjacent to the protrusion of the first leg section in its folded position.

18. The stand for an electronic apparatus according to claim 17, wherein the first inner edge of the first leg section defines a first finger insertion cutout adjacent to the protrusion of the second leg section in its folded position, and the second inner edge of the second leg section defines a second finger insertion cutout adjacent to the protrusion of the third leg section in its folded position.

19. The stand for an electronic apparatus according to claim 1 made at least partially of slippery resistant material.

20. The stand for supporting a rear surface of an electronic apparatus at different inclining heights to thereby change the orientation of the electronic apparatus, wherein the rear surface of the electronic apparatus includes a first engaged section and a second engaged section, the stand comprising:
a base section composed of a plate member having a first edge and a second edge, the plate member being configured to rotationally support the electronic apparatus about a first rotational axis adjacent to the first edge defining an area for facing the rear surface of the electronic apparatus, the base section including a first engaging section adjacent to the first edge of the plate member, the first engaging section having a hood shape to engage with the first engaged section provided on the rear surface of the electronic apparatus to form the first rotational axis; and
a plurality of leg sections provided in the area defined by the plate member, the plurality of leg sections each including a lock section configured to lock with the second engaged section of the rear surface of the electronic apparatus, and a support section provided to rotate about a second rotational axis adjacent to the second edge of the plate member to serve as a rotational support for the leg section relative to the plate member, the plurality of the leg sections sharing the second rotational axis as a common rotational axis and respectively having different distances from the second rotational axis to the protrusion.

21. The stand for an electronic apparatus according to claim 20, wherein each of the leg sections has a plate shape and is rotatable between a folded position, at which the leg section is folded to the plate member of the base section, and a support position, at which the leg section is erected from the plate member of the base section.

22. The stand for an electronic apparatus according to claim 21, wherein the base section further includes a second engaging section adjacent to the second edge of the plate member, the second engaging section being configured to engage with the second engaged section of the rear surface of the electronic apparatus when the leg sections are folded to their respective folded positions.

23. A combination comprising:
an electronic apparatus having a rear surface on which a first engaged section and a second engaged section are provided; and
a stand configured to support the rear surface of the electronic apparatus at different inclining heights to thereby change the orientation of the electronic apparatus, the stand including:
a base section composed of a plate member having a first edge and a second edge, the plate member being configured to rotationally support the electronic apparatus about a first rotational axis adjacent to the first edge and defining an area for facing the rear surface of the electronic apparatus, the base section including a first engaging section, adjacent to the first edge, to engage with the first engaged section provided on the rear surface of the electronic apparatus to form the first rotational axis; and
a plurality of leg sections provided in the area defined by the plate member, the plurality of leg sections each including a lock section configured to lock with the second engaged section of the rear surface of the electronic apparatus, and a support section provided to rotate about a second rotational axis adjacent to the second edge of the plate member to serve as a rotational support for the leg section relative to the plate member, the plurality of leg sections sharing the second rotational axis as a common rotational axis and respectively having different distances from the second rotational axis to the lock section.

24. The combination according to claim 23, wherein each of the leg sections has a plate shape and is rotatable between a folded position, at which the leg section is folded to the plate member of the base section, and a support position, at which the leg section is erected from the plate member of the base section, and
when one the leg sections is rotated to its support position, the lock section of the leg section is inserted into the second engaged section.

* * * * *

UNITED STATES PATENT AND TRADEMARK OFFICE
CERTIFICATE OF CORRECTION

| | | |
|---|---|---|
| PATENT NO. | : 9,066,442 B2 | Page 1 of 1 |
| APPLICATION NO. | : 14/170230 | |
| DATED | : June 23, 2015 | |
| INVENTOR(S) | : Volker Huebner | |

It is certified that error appears in the above-identified patent and that said Letters Patent is hereby corrected as shown below:

Claims

Column 22, Line 56, Claim 20
"the first engaging section having a hood shape to engage" should read, --the first engaging section having a hook shape to engage--.

Signed and Sealed this
Third Day of November, 2015

Michelle K. Lee
*Director of the United States Patent and Trademark Office*